(12) United States Patent
Yamamoto et al.

(10) Patent No.: US 9,728,482 B2
(45) Date of Patent: Aug. 8, 2017

(54) SEMICONDUCTOR DEVICE HAVING A SUBSTRATE RESTRAINED FROM THERMAL DEFORMATION

(71) Applicant: KABUSHIKI KAISHA TOSHIBA, Tokyo (JP)

(72) Inventors: Nobuhiro Yamamoto, Yokohama Kanagawa (JP); Yousuke Hisakuni, Zama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/018,547

(22) Filed: Feb. 8, 2016

(65) Prior Publication Data

US 2017/0069559 A1 Mar. 9, 2017

(30) Foreign Application Priority Data

Sep. 4, 2015 (JP) ................. 2015-174702

(51) Int. Cl.
| | | |
|---|---|---|
| H01L 23/00 | (2006.01) | |
| H01L 23/367 | (2006.01) | |
| H01L 27/108 | (2006.01) | |
| H01L 27/115 | (2017.01) | |
| H01L 23/495 | (2006.01) | |
| H01L 23/31 | (2006.01) | |

(52) U.S. Cl.
CPC ...... *H01L 23/3675* (2013.01); *H01L 23/3107* (2013.01); *H01L 23/49551* (2013.01); *H01L 24/14* (2013.01); *H01L 27/108* (2013.01); *H01L 27/115* (2013.01); *H01L 2924/15311* (2013.01); *H01L 2924/351* (2013.01)

(58) Field of Classification Search
CPC ..... H01L 2924/15311; H01L 2924/351; H01L 23/3107; H01L 23/49551
See application file for complete search history.

(56) References Cited

U.S. PATENT DOCUMENTS

| | | | |
|---|---|---|---|
| 7,663,254 B2 | 2/2010 | Hara | |
| 2013/0069217 A1 | 3/2013 | Nakao | |
| 2013/0241046 A1* | 9/2013 | Miyashita | ........... H01L 23/3731 257/705 |
| 2016/0044790 A1* | 2/2016 | Cho | ............. H05K 1/189 361/760 |
| 2016/0056091 A1* | 2/2016 | Kim | ............. H05K 1/189 257/368 |
| 2016/0293513 A1* | 10/2016 | Hiruta | ................. H01L 23/3672 |

FOREIGN PATENT DOCUMENTS

| | | |
|---|---|---|
| JP | 3372169 B2 | 1/2003 |
| JP | 2005322661 A | 11/2005 |
| JP | 2015095561 A | 5/2015 |

* cited by examiner

*Primary Examiner* — Ngan Ngo
(74) *Attorney, Agent, or Firm* — Patterson & Sheridan, LLP

(57) ABSTRACT

A semiconductor device includes a housing, a substrate housed in and fixed to the housing, and a semiconductor module package disposed on a surface of the substrate. A protrusion is formed on the housing, protrudes towards the substrate, located adjacent to the semiconductor module package, and directly or indirectly urges the substrate in a direction away from the protrusion.

20 Claims, 10 Drawing Sheets

SEMICONDUCTOR DEVICE HAVING A SUBSTRATE RESTRAINED FROM THERMAL DEFORMATION

CROSS-REFERENCE TO RELATED APPLICATION

This application is based upon and claims the benefit of priority from Japanese Patent Application No. 2015-174702, filed Sep. 4, 2015, the entire contents of which are incorporated herein by reference.

FIELD

Exemplary embodiments described herein relate to an electronic device, in particular, a heat-tolerant semiconductor device having a semiconductor module package disposed on a substrate.

BACKGROUND

A variety of electronic devices includes a substrate and an electronic component which is mounted on the substrate. An electrode of the electronic component is connected to, for example, an electrode provided on the substrate through soldering. A portion in which the electronic component and the substrate are connected to each other by soldering is reinforced through, for example, underfill. However, use of the underfill may increase a manufacturing cost of the electronic device.

DETAILED DESCRIPTION

In general, according to an embodiment, a semiconductor device includes a housing, a substrate housed in and fixed to the housing, and a semiconductor module package disposed on a surface of the substrate. A protrusion is formed on the housing, protrudes towards the substrate, located adjacent to the semiconductor module package, and directly or indirectly urges the substrate in a direction away from the protrusion.

Hereinafter, the electronic device according to one or more embodiments will be specifically described with reference to the drawings. Here, the disclosure is not limited to these embodiments.

In the following description, for components in the embodiments and the description thereof, various expressions may be used. However, other expressions that are not used may be applied to the components and the description thereof. In addition, other expressions may be used for components and the description thereof for which various expressions are not used.

First Embodiment

Figure 1:
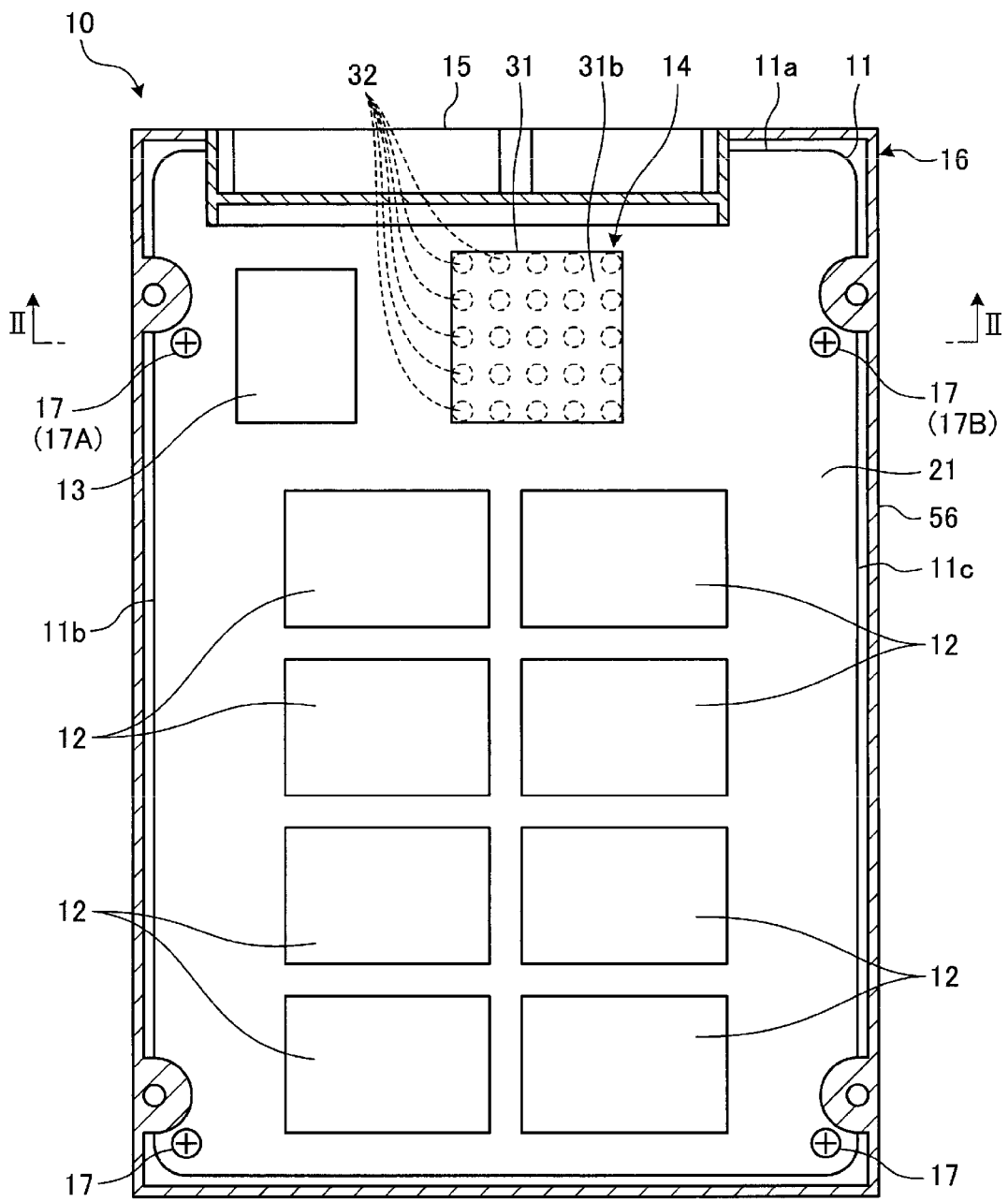
FIG. 1 is a plan view of an inside of an SSD according to a first embodiment.

Hereinafter, a first embodiment will be described with reference to FIGS. 1 to 5. FIG. 1 is a plan view of an internal structure of a solid state drive (SSD) 10 according to the first embodiment. The SSD 10 is an example of an electronic device, and can be referred to, for example, a semiconductor storage device, a storage device, or a component. Examples of the electronic device is not limited to the SSD 10 and include a personal computer, a portable computer, a tablet, a mobile phone, a smart phone, a television apparatus, a digital camera, a hard disk drive (HDD), and other electronic devices.

As illustrated in the respective drawings, an X-axis, a Y-axis, and a Z-axis are defined in the specification of the present application. The X-axis, the Y-axis, and the Z-axis are orthogonal to each other. The X-axis is along a width of the SSD 10. The Y-axis is along a length of the SSD 10. The Z-axis is along a thickness of the SSD 10.

As illustrated in FIG. 1, the SSD 10 includes a substrate 11, a plurality of flash memories 12, a dynamic random-access memory (DRAM) 13, a controller 14, a connector 15, a housing 16, and a plurality of screws 17. The controller 14 is an example of the first electronic component and a member which has a lower thermal expansion coefficient and a higher elasticity coefficient than the substrate, and can be referred to as, for example, a component or a source of heat. The screw 17 is an example of a first fixing member and a second fixing member and can be referred to as, for example, an attaching portion or a fastener.

The substrate 11 is, for example, a printed circuit board (PCB). However, the substrate 11 is not limited to the printed circuit board, and it may be other substrates. The substrate 11 is formed of various types of materials, for example, woven glass fabric as reinforcement, an epoxy resin as an insulating material, and a copper foil as a conductor.

Figure 2:
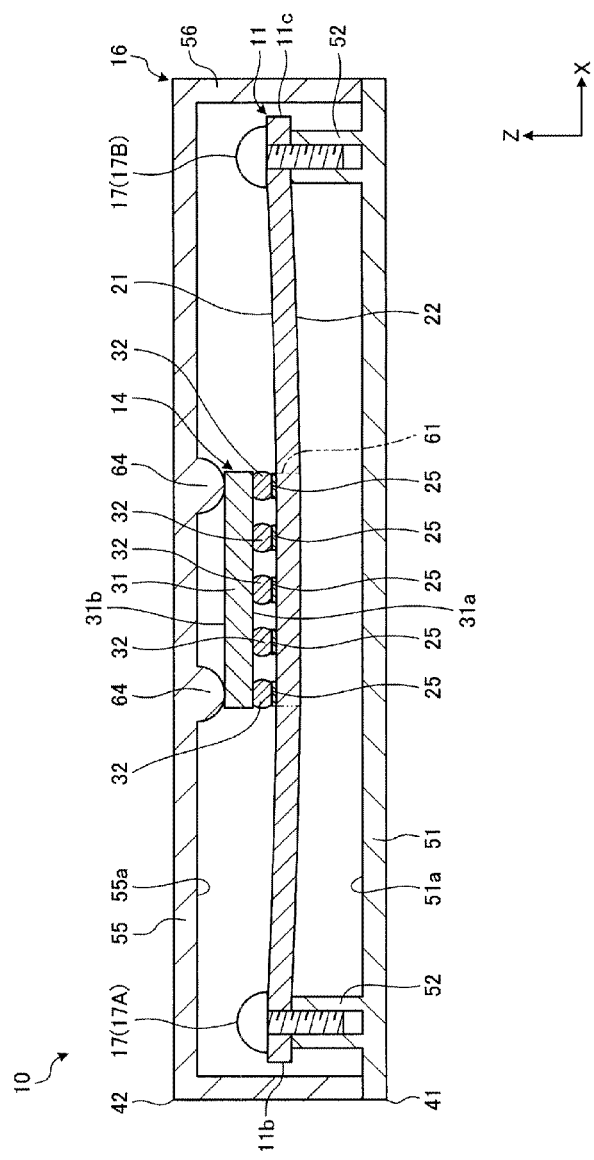
FIG. 2 is a cross-sectional view of the SSD according to the first embodiment.

FIG. 2 is a cross-sectional view of the SSD 10 taken along line II-II in FIG. 1. The DRAM 13, the flash memory 14, and the connector 15 are not illustrated in the subsequent drawings, because these components are not along the line II-II. As illustrated in FIG. 2, the substrate 11 includes a first surface 21 and a second surface 22.

Each of the first surface 21 and the second surface 22 is substantially directed to a direction along the Z-axis, and is substantially flat surface. In the present embodiment, the direction along the Z-axis is also referred to a thickness direction, for example, and includes an upper direction and a lower direction. The upper direction is an example of a third direction. The lower direction is an example of a second direction and a bending direction. The upper direction in the present embodiment is a direction which is orthogonal to the first surface 21 and toward the first surface 21 from the second surface 22. In addition, an example of the third direction includes, for example, a direction orthogonal to the first surface 21, and a direction intersect with the first surface 21 at an angle which is smaller than 90 degrees, and toward the first surface 21 from the second surface 22, but does not include a direction parallel with the first surface 21. Further, the lower direction in the present embodiment is a direction is straight to the first surface 21 and toward the second surface 22 from the first surface 21. In addition, an example of the second direction includes a direction orthogonal to the first surface 21, and a direction intersect with the first surface 21 at an angle which is smaller than 90 degrees, and toward the first surface 21 from the second surface 22, but does not include a direction parallel with the first surface 21. The second surface 22 is on the side opposite to the first surface 21 in the direction along the Z-axis.

A plurality of first pads 25 is provided on the first surface 21. The plurality of first pads 25 is an example of a plurality of first pads and first electrodes. The plurality of first pads 25 is arranged, for example, in a matrix shape. For example, a group of first pads 25 is arranged in a direction along the X-axis, and a plurality of the groups is arranged in a direction along the Y-axis. In other words, a group of first pads 25 is arranged in the direction along the Y-axis, and a plurality of the groups is arranged in the direction along the X-axis. The direction along the X-axis is an example of a fourth direction. Meanwhile, examples of the fourth direction include a direction along an imaginary line which connects one point in the first pad 25 and one point of the another first pad 25 which is adjacent to the first pad 25 when the first pad 25 is viewed from top, but do not include a direction orthogonal to an imaginary line which connects the center of each of two adjacent first pads 25.

As illustrated in FIG. 1, the plurality of flash memories 12, the DRAM 13, and the controller 14 are mounted on the first surface 21. In other words, the plurality of flash memories 12, the DRAM 13, and the controller 14 are attached onto the first surface 21, and are electrically connected to a circuit on the substrate 11. Alternatively, the plurality of flash memories 12 and the DRAM 13 may be mounted on the second surface 22.

The flash memory 12 is, for example, a NAND-type flash memory. In addition, the flash memory 12 may be other types of flash memories. The DRAM 13 is capable of performing a high speed storing operation compared with the flash memory 12.

The controller 14 is, for example, a system-on-a-chip (SoC). In addition, the controller 14 may be another electronic component. The controller 14 controls, for example, the flash memory 12, the DRAM 13, and other electronic components of the SSD 10.

The connector 15 is provided in a first end portion 11a of the substrate 11 in the direction along the Y-axis. The first end portion 11a includes one end surface of the substrate 11 in the direction along the Y-axis, and a portion in the vicinity of the end surface. The SSD 10 is connected to a host such as a personal computer via the connector 15.

As illustrated in FIG. 2, the controller 14 includes a first package 31, and a plurality of first solder bumps (hereinafter, referred to as first bumps) 32. The plurality of first bumps 32 is an example of a plurality of first bumps and a first terminal. When the controller 14 is considered as one member, the controller 14 has a lower thermal expansion coefficient and a higher elasticity coefficient than the substrate 11.

The first package 31 includes, for example, a circuit board, a plurality of electronic components mounted on the circuit board, and a sealing resin which seals the circuit board and the plurality of electronic components. The first package 31 includes a first bottom surface 31a and a first top surface 31b. The first bottom surface 31a and the first top surface 31b are substantially directed to the direction along the Z-axis. In other words, the first bottom surface 31a is substantially directed downward and the first top surface 31b is substantially directed upward. The first bottom surface 31a is directed to the first surface 21 of the substrate 11. The first top surface 31b is on the side opposite to the first bottom surface 31a.

The plurality of first bumps 32 is arranged on the first bottom surface 31a of the first package 31. Each of the first bumps 32 is attached to one of a plurality of electrodes of the controller 14, which is disposed on the first bottom surface 31a.

The plurality of first bumps 32 corresponds to the plurality of first pads 25, and is arranged in a matrix shape, for example. That is, a group of first bumps 32 is arranged in the direction along the X-axis, and a plurality of the groups is arranged in the direction along the Y-axis. In other words, a group of first bumps 32 is arranged in the direction along the Y-axis, and a plurality of the groups is arranged in the direction along the X-axis. Each of the first bumps 32 is connected to the corresponding one of the first pads 25. Also, each of the electrodes of the controller 14 is soldered to corresponding one of the first pads 25 by the first bump 32. As a result, the controller 14 is mounted on the first surface 21. In other words, the controller 14 is disposed on the substrate 11.

The housing 16 has, for example, a substantially rectangular parallelepiped shape, and accommodates the substrate 11. The substrate 11 which is accommodated in the housing 16 may be exposed to the outside through an opening of the housing 16, for example. When the entire substrate 11 is positioned outside the housing 16, the substrate 11 is not accommodated in the housing 16. The housing 16 includes a bottom cover 41 and a top cover 42. In the present embodiment, the housing 16 is formed by attaching the top cover 42 to the bottom cover 41. In other words, the top cover 42 is coupled with the bottom cover 41. The housing 16 may include another member such as a frame.

Although the bottom cover 41 is formed of, for example, an aluminum alloy, the bottom cover 41 may be formed of another material such as a synthetic resin. The bottom cover 41 includes a first wall 51 and a plurality of bosses 52.

The first wall 51 has a substantially flat quadrilateral plate shape. In addition, the first wall 51 may include, for example, a concave portion and a convex portion. The first wall 51 includes a first inner surface 51a. The first inner surface 51a is directed to the inside of the housing 16, and is directed to the second surface 22 of the substrate 11, which is accommodated in the housing 16.

Each of the bosses 52 has a cylindrical shape which projected to the direction along the Z-axis from the first inner surface 51a of the first wall 51. A female screw is formed in the inner surface of the cylindrical boss 52. The boss 52 supports a second end portion 11b and a third end portion 11c of the substrate 11 in the direction along the X-axis. The second end portion 11b includes one end surface of the substrate 11 in the direction along the X-axis, and a portion in the vicinity of the one end surface described above. The third end portion 11c includes the other end surface of the substrate 11 in the direction along the X-axis and a portion in the vicinity of the other end surface as described above. Here, the boss 52 may support another portion of the substrate 11.

Although the top cover 42 is formed of, for example, an aluminum alloy, the top cover 42 may be formed of another material such as a synthetic resin. The top cover 42 includes a second wall 55 and a third wall 56.

The second wall 55 has a substantially flat quadrilateral plate shape. In addition, the second wall 55 may include a concave portion and a convex portion. The second wall 55 includes a second inner surface 55a. The second inner surface 55a is directed to the inside of the housing 16, and to the first surface 21 of the substrate 11 which is accommodated in the housing 16. In the direction along the Z-axis, the substrate 11 is positioned between the first wall 51 and the second wall 55.

The third wall 56 extends in the direction along the Z-axis from a plurality of end portions of the second wall 55. The third wall 56 is in contact with the first wall 51 of the bottom cover 41, and serves as a side surface of the housing 16. The third wall 56 surrounds the substrate 11. In other words, in the direction along the X-axis, the substrate 11 is positioned between the third walls 56. Further, in the direction along the Y-axis, the substrate 11 is positioned between the third walls 56.

The plurality of screws 17 includes a first screw 17A and a second screw 17B. The first screw 17A is an example of the first fixing member. The second screw 17B is an example of the second fixing member. The second screw 17B is separated from the first screw 17A in the direction along the X-axis. The direction along the X-axis is an example of the first direction. Here, an example of the first direction includes a direction along an imaginary line which connects one point in the first screw 17A and one point in the second screw 17B when the substrate 11 is viewed from top, but do not include a direction orthogonal to an imaginary line which connects the center of each of the first screw 17A and the second screw 17B. The plurality of first pads 25 is positioned between the first screw 17A and the second screw 17B in the direction along the X-axis. That is, the plurality of first pads 25 is disposed in a middle portion of the substrate 11 between the first screw 17A and the second screw 17B in the direction along the X-axis. For this reason, the controller 14 is provided in the middle portion of the substrate 11 between the first screw 17A and the second screw 17B in the direction along the X-axis. Alternatively, the controller 14 may be arranged at another position. When the substrate 11 is viewed from top, the middle portion of the substrate 11 between the first screw 17A and the second screw 17B in the direction along the X-axis includes a portion which is deviated to the direction orthogonal to the imaginary line from the imaginary line which connects the first screw 17A and the second screw 17B, but does not include a portion which is deviated from an area between the first screw 17A and the second screw 17B in the direction along the X-axis.

The plurality of screws 17 fixes the substrate 11 to the boss 52 which supports the substrate 11. That is, the plurality of screws 17 fixes the substrate 11 to the housing 16. For example, each of the screws 17 is screwed into the female screw which is provided in the boss 52 by passing through a hole which is provided in the substrate 11. The screw 17 may not directly fix the substrate 11 to the housing 16, and may directly fix the substrate 11 to the housing 16 via another member. The screw 17 restricts portions (the second end portion 11b and the third end portion 11c) which fixed to the substrate 11 by the screw 17 from relatively moving with respect to the housing 16. The portion which is fixed to the substrate 11 by the screw 17 includes a portion of the substrate 11 which overlaps a screw head of the screw 17 and the boss 52 in the direction along the Z-axis. In the present embodiment, "overlapping in a certain direction" means that when viewed from top in the corresponding direction, at least a portion of one member and at least a portion of another member exist at the same position.

As described above, in the substrate 11 fixed by the screw 17, the plurality of first pads 25 is closer to the controller 14 than each of the screw 17 is. That is, a distance between each of the first pads 25 and the controller 14 is shorter than a distance between each of the screws 17 and the controller 14. In addition, a portion (hereinafter, referred to as a mounted portion) 61 of the substrate 11 on which the controller 14 is mounted is closer to the controller 14 than each of the screws 17 is. That is, a distance between the mounted portion 61 and the controller 14 is shorter than the distance between each of the screws 17 and the controller 14. FIG. 2 illustrates the mounted portion 61 which is separated by a two-dot chain line. The mounted portion 61 is an example of a portion of the substrate on which the first electronic component is mounted, a portion which is closer to the first electronic component than the fixing member on the substrate is, and a portion of the substrate on which the first electrode is provided.

In the present embodiment, the mounted portion 61 is a portion of the substrate 11 which overlaps, in the direction along the Z-axis, an area surrounded by a connection line which is arranged at one end of the rows in the plurality of first pads 25 which is arranged in the direction along the X-axis, and connects the outside of the plurality of first pads 25 and extends to the direction along the Y-axis, and a connection line which is arranged at the other end of the rows in the plurality of first pads 25 which is arranged in the direction along the X-axis, and connects the outside of the plurality of first pads 25 and extends to the direction along the Y-axis, a connection line which is arranged at one end of the rows in the plurality of first pads 25 which is arranged in the direction along the Y-axis, and connects the plurality of first pads 25 and extends to the direction along the X-axis, and a connection line which is arranged at the other end of the rows in the plurality of first pads 25 which is arranged in the direction along the Y-axis, and connects the outside of the plurality of first pads 25 and extends to the direction along the X-axis.

The mounted portion 61 includes a portion of the substrate 11 in which the first pad 25 is provided. In the present embodiment, the portion of the substrate 11 in which the first pad 25 is provided is a portion of the substrate 11 which overlaps the first pad 25 in the direction along the Z-axis. For this reason, the first pad 25 is arranged in the mounted portion 61.

A plurality of projections 64 is provided on the second wall 55 of the top cover 42. The plurality of projections 64 can be referred to as a pressing portion, a restricting portion, a restraining portion, a supporting portion, or a portion. In the present embodiment, the top cover 42 which has the plurality of projections 64 is an example of a contact portion. The plurality of projections 64 is respectively projected to the controller 14 which is mounted on the first surface 21 of the substrate 11 from the second inner surface 55a of the second wall 55. In other words, the projection 64 is projected downward from the second wall 55.

The projection 64 is integrally formed with the second wall 55. In other words, the projection 64 is provided on the second wall 55 of the top cover 42. For this reason, projection 64 is fixed to the housing 16 without moving with respect to the housing 16. Here, the projection 64 may be separately formed from the second wall 55.

Each of the plurality of projections 64 is in contact with the first top surface 31b of the first package 31 of the controller 14. Further, the projection 64 is indirectly contact with the mounted portion 61 of the substrate 11 via the controller 14 from the direction along the Z-axis. The projection 64 in the present embodiment presses the substrate 11 via the controller 14 downward.

When the projection 64 presses the substrate 11, the substrate 11 is bent so as to be projected downward (a negative direction in the direction along the Z-axis). That is, the substrate 11 is bent so as to be projected in the direction in which the projection 64 presses the controller 14. In the direction along the Z-axis, the mounted portion 61 of the bent substrate 11 is positioned in the direction lower than the portion fixed by the screw 17. Expressed in another way, the substrate 11 is bent so as to be closer to the first wall 51 as approaching the mounted portion 61 from the screw 17.

A reaction force generated from the bent substrate 11 is applied on the top cover 42 and the controller 14. However, the bottom cover 41 and the top cover 42 have the higher elasticity coefficient than the substrate 11. In other words, rigidity of each of the bottom cover 41 and the top cover 42 is higher than that of the substrate 11. In addition, the controller 14 has the higher elasticity coefficient than the substrate 11. For this reason, an elastic deformation amount (a distance which is displaced by the deformation) of the top cover 42 including the projection 64 and the controller 14 is considerably smaller than the elastic deformation amount of the substrate 11.

The projection 64 is in contact with a portion of the controller 14 which overlaps the first pads 25, which are arranged at the end of the rows in the direction along the X-axis. In other words, one first pad 25 which is arranged at the end of the plurality of first pads 25 in the direction along the X-axis is positioned between the projection 64 of the top cover 42 and the substrate 11 in the direction along the Z-axis.

Each of the plurality of first bumps 32 is compressed between the projection 64 of the top cover 42 and the substrate 11 in the direction along the Z-axis. In the direction along the Z-axis, a compression amount (a length shrunken by the compression) of the first bump 32 is greater than the compression amount of the substrate 11. In the direction along the Z-axis, the compression amount of the substrate 11 is greater than the compression amount the top cover 42 including the projection 64.

Figure 3:
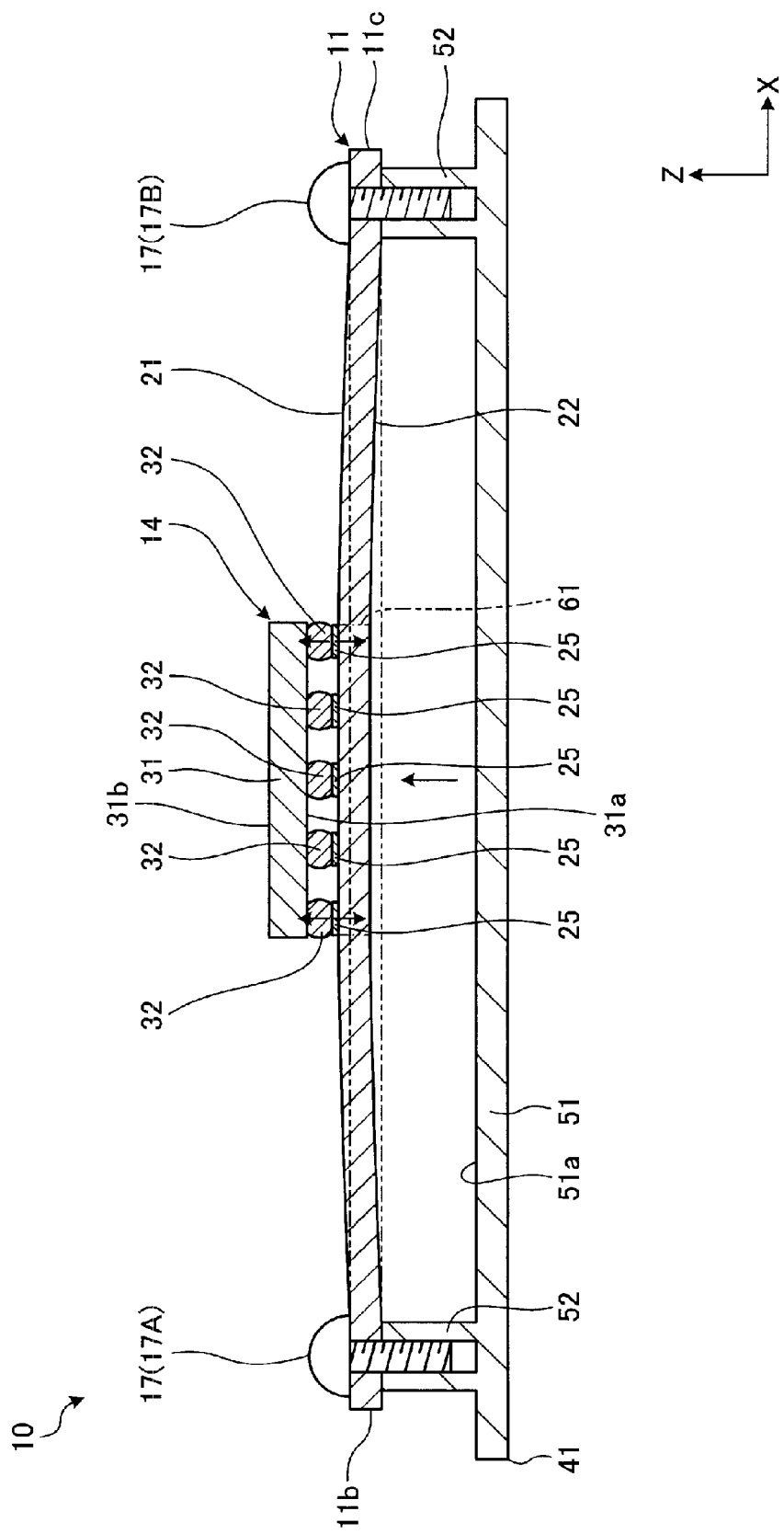
FIG. 3 is a cross-sectional view of the SSD from which a top cover is detached.

FIG. 3 is a cross-sectional view of the SSD 10 according to the first embodiment, of which the top cover 42 is detached. The controller 14 generates heat in accordance with operation of the SSD 10. For example, when temperature of the substrate 11 is raised due to the generated heat, the substrate 11 is thermally expanded.

The substrate 11 is fixed to the housing 16 by the plurality of screws 17. For this reason, the first screw 17A and the second screw 17B restrict a portion of the substrate 11 between the first screw 17A and the second screw 17B from extending in the direction along the X-axis due to the temperature increase.

The middle portion of the thermally expanded substrate 11 between the first screw 17A and the second screw 17B in the direction along the X-axis tends to be bent so as to be projected upward. In other words, the portion of the substrate 11 between the first screw 17A and the second screw 17B in the direction along the X-axis tends to be bent so as to be projected upward.

As illustrated in FIG. 3, when the top cover 42 is detached from the SSD 10, the portion of the substrate 11 between the first screw 17A and the second screw 17B is bent to be projected upward. FIG. 3 illustrates the bent substrate 11 by a solid line and illustrates the substrate 11 before being bent by a two-dot chain line. When the substrate 11 is bent, the mounted portion 61 moves upward further than when the substrate 11 is not bent. That is, the mounted portion 61 of the substrate 11 at a certain temperature is positioned upward further than the mounted portion 61 of the substrate 11 at a lower temperature.

When the substrate 11 is bent, force (a tensile stress) is generated so as to separate the connection portion between the first pads 25 arranged at the end of the rows in the direction along the X-axis and the corresponding first bumps 32, from one another in the direction along the Z-axis. The tensile stress which is schematically depicted by an arrow in FIG. 3 may cause fatigue with respect to the connection portion between the first pad 25 and the first bump 32.

As described above, when the substrate 11 is heated, a force directing upward is applied on the mounted portion 61. In addition, the direction in which the force which is applied on the mounted portion 61 by the heated substrate 11 is determined by a difference between the coefficients of thermal expansion of the various portions of the substrate 11.

Figure 4:
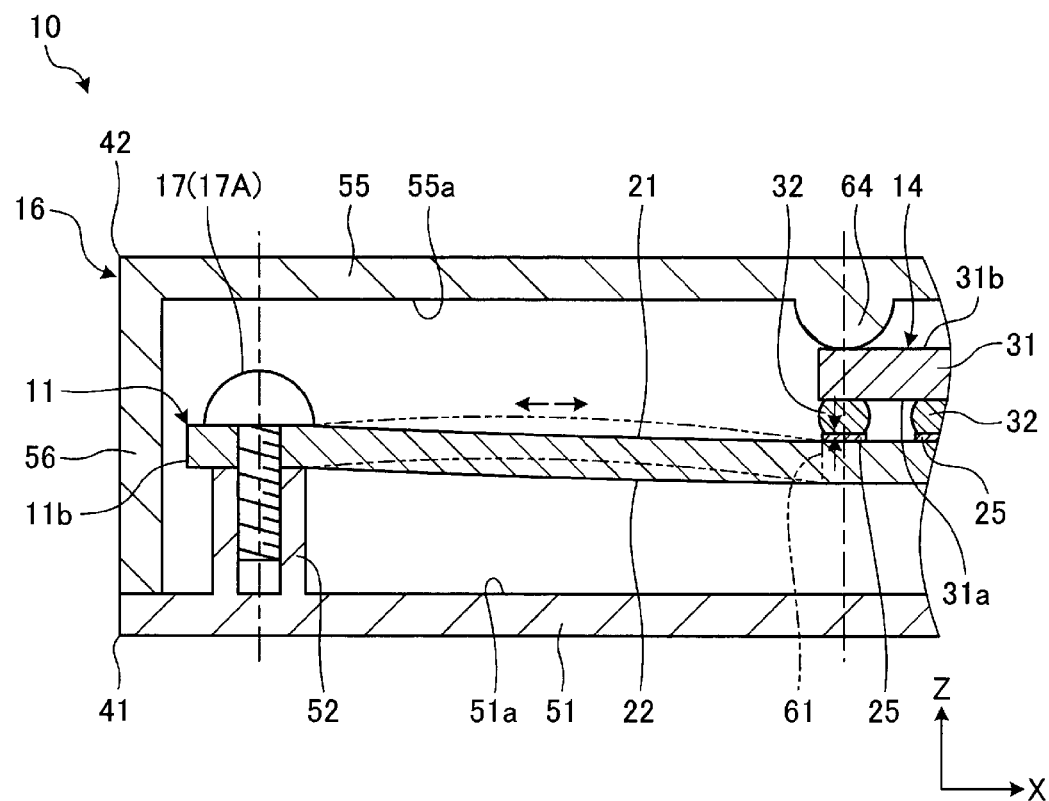
FIG. 4 is an enlarged cross-sectional view of a portion of the SSD according to the first embodiment.

FIG. 4 is a cross-sectional view of a portion of the SSD 10 according to the first embodiment. As illustrated in FIG. 4, in the SSD, the projection 64 of the top cover 42 is in contact with the controller 14. For this reason, the projection 64 restricts the mounted portion 61 on the thermally expanded substrate 11 from moving upward. Expressed in another way, the projection 64 restricts the portion of the thermally expanded substrate 11 in which the first pad 25 is provided from moving upward. In addition, the projection 64 restricts the portion of the thermally expanded substrate 11 at which one first pad 25 arranged at the end of the rows in the direction along the X-axis from moving upward.

The force directing upward which is applied on the mounted portion 61 by the substrate 11 is applied on the top cover 42 via the projection 64. However, the bottom cover 41 and the top cover 42 have the higher elasticity coefficient than the substrate 11. In addition, the thermal expansion coefficient of the top cover 42 including the projection 64 is lower than the thermal expansion coefficient of the substrate 11. For this reason, in the direction along the Z-axis, a position of the projection 64 of the thermally expanded top cover 42 is substantially the same as the position of the projection 64 of the top cover 42 before being thermally expanded. Further, the controller 14 has the higher elasticity coefficient and the lower thermal expansion coefficient than the substrate 11. For this reason, in the direction along the Z-axis, the position of the thermally expanded controller 14 is substantially the same as the position of the controller 14 before being thermally expanded. The projection 64, which is at the position which is substantially the same as before being thermally expanded, presses the substrate 11 via the controller 14 which is substantially at the same position as before being thermally expanded, and holds the mounted portion 61 to be substantially at the same position as before being thermally expanded. Here, the position of the projection 64 is not limited thereto.

As a comparative example, it is assumed that, instead of the projection 64, a member (for example, the thermal conducting sheet) having a lower elasticity coefficient than the substrate 11 is disposed between the controller 14 and the top cover 42. In this case, the force directing upward which is applied on the mounted portion 61 by the substrate 11 is applied on the thermal conducting sheet via the controller 14. Since the thermal conducting sheet has the lower elasticity coefficient than the substrate 11, the thermal conducting sheet is compressed between the controller 14 and the top cover 42 (elastic deformation). In addition, if the thermal expansion coefficient of the thermal conducting sheet is higher than the thermal expansion coefficient of the substrate 11, a relative position between the controller 14 and the top cover 42 can be changed by the thermally expanded thermal conducting sheet. That is, when the thermal conducting sheet is elastically deformed and thermally expanded, the substrate 11 is likely to move upward. In other words, the sheet may suppress the movement of the substrate 11, but does not restrict the movement of the substrate 11. On the other hand, in the present embodiment, the top cover 42 in which the projection 64 having the lower thermal expansion coefficient and the higher elasticity coefficient than the substrate 11 is in contact with the controller 14. As described above, the mounted portion 61 is held by the projection 64 to be substantially at the same position as before being thermally expanded. Accordingly, the projection 64 of the top cover 42 restricts the movement of the substrate 11. In the present embodiment, "suppress" means that a possibility that a certain result occurs is reduced. In the present embodiment, "restrict" means that a possibility that a certain result occurs is substantially prevented; however, it includes a case where it is not possible to prevent the result from occurring depending on various conditions. When a certain result is restricted, the corresponding result is suppressed. However, when a certain result is suppressed, the corresponding result is not necessarily restricted.

Since the projection 64 of the top cover 42 restricts the movement of the mounted portion 61, a force (compression stress) which causes the first bump 32 and the corresponding first pad 25 to close to each other in the direction along the Z-axis is applied to the connection portion between the first bump 32 and the corresponding first pad 25 to close to each other. FIG. 4 schematically illustrates the compression stress with an arrow.

Figure 5:
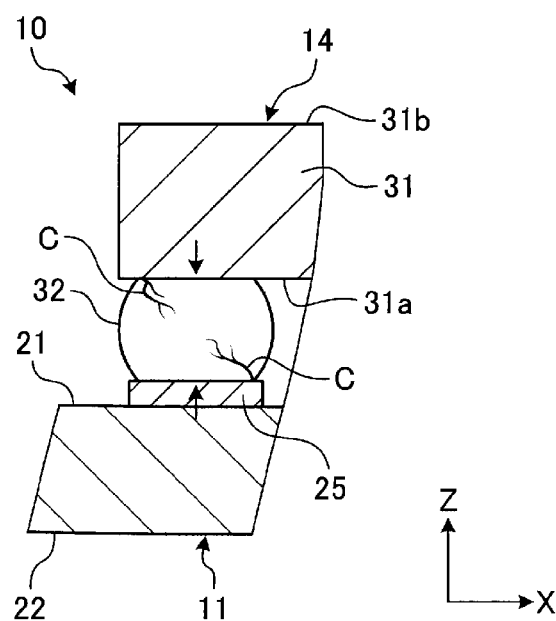
FIG. 5 is an enlarged cross-sectional view of a portion if the SSD in the vicinity of a first bump thereof.

FIG. 5 is a cross-sectional view of a portion of the SSD 10 in the vicinity of the first bump 32. As indicated by an arrow in FIG. 5, when the compression stress is applied to the connection portion between the first bump 32 and the corresponding first pad 25, a crack C may be generated in the first bump 32.

The crack C generated by the compression stress obliquely advances, for example, from one end portion of the first bump 32 toward the other end portion in the Z direction. Even when such a crack C is generated, the first bump 32 tends to hold the electrical connection between the first package 31 and the first pad 25.

On the other hand, when the tensile stress as illustrated in FIG. 3 is generated in the connection portion between the first bump 32 and the corresponding first pad 25, the crack may be generated in the first bump 32. The crack generated by the tensile stress is, for example, generated in the connection portion (a boundary) between the first bump 32 and the first pad 25. When such a crack is generated, the electrical connection between the first package 31 and the first pad 25 may be damaged. In the present embodiment, as the compression stress is generated in the connection portion between the first bump 32 and the first pad 25, the electrical connection between the first package 31 and the first pad 25 is not likely to be disconnected.

As described above, the projection 64 restricts the mounted portion 61 of the thermally expanded substrate 11 from moving upward. For this reason, in the direction along the X-axis, a portion of the thermally expanded substrate 11 between the mounted portion 61 and the first screw 17A tends to be bent so as to be projected upward. Similarly, in the direction along the X-axis, a portion of the thermally expanded substrate 11 between the mounted portion 61 and the second screw 17B tends to be bent so as to be projected upward. FIG. 4 illustrates a bent portion of the substrate 11 between the mounted portion 61 and the first screw 17A, by a two-dot chain line. When a portion of the substrate 11 between the mounted portion 61 and the first screw 17A is bent in the direction along the X-axis, the tensile stress is generated in a portion of the substrate 11 between the mounted portion 61 and the first screw 17A in the direction substantially along the X-axis. FIG. 4 schematically illustrates the tensile stress with an arrow.

The substrate 11 is bent so as to be projected downward by the projection 64. A pressing force of the projection 64 which is applied on the substrate 11 is stronger than the force which causes the portion between the mounted portion 61 and the first screw 17A to be bent so as to be projected upward. In the same way, the pressing force of the projection 64 which is applied on the substrate 11 is stronger than the force which causes the portion of the thermally expanded substrate 11 between the mounted portion 61 and the second screw 17B. For this reason, the projection 64 holds the substrate 11 to be in a state of being bent so as to be projected downward.

As indicated by the two-dot chain line in FIG. 4, when a portion of the substrate 11 between the mounted portion 61 and the first screw 17A is bent in the direction along the X-axis, the portion of the substrate 11 approaches the first package 31 of the controller 14. For this reason, the compression stress is generated in the connection portion between the first bump 32 and the first pad 25.

As described above, the projection 64 restricts the mounted portion 61 of the substrate 11 from moving upward. With this, a portion (the portion of the substrate 11 between the mounted portion 61 and the first screw 17A, and the portion between the mounted portion 61 and the second screw 17B in the direction along the X-axis) which is adjacent to the mounted portion 61 is bent so as to be projected upward due to the thermal expansion. With this, the compression stress is generated in the connection portion between the first bump 32 and the first pad 25, and the electrical connection between the first package 31 and the first pad 25 is not likely to be disconnected.

As described above, in the SSD 10 according to the first embodiment, when the substrate 11 which is fixed by the screw 17 is, for example, thermally expanded, the substrate 11 tends to be bent so as to be projected upward. The substrate 11 is likely to be bent in the vicinity of a frame of the mounted portion 61 so as to increase the distance between the controller 14 and the first surface 21 of the substrate 11, for example. When the substrate 11 is bent in such a way, the tensile stress may be generated in the connection portion (the connection portion between the first pad 25 and the first bump 32) between the controller 14 and the first surface 21. However, the projection 64 restricts the mounted portion 61 from moving upward. For this reason, the change of the distance between the controller 14 and the first surface 21 of the substrate 11 due to the bent substrate 11 is suppressed. Accordingly, the tensile stress is generated in the connection portion between the controller 14 and the first surface 21 of the substrate 11 due to the bent substrate 11, and the damage to the connection portion can be suppressed. When the damage to the connection portion between the controller 14 and the first surface 21 of the substrate 11 is suppressed by the projection 64, for example, an increase in the cost of the SSD 10 can be suppressed compared with a case where the damage to the connection portion between the controller 14 and the first surface 21 is suppressed by an underfill.

As indicated by the two-dot chain line in FIG. 4, when the portion of the substrate 11 between the mounted portion 61 and the first screw 17A in the direction along the X-axis is bent upward, the portion of the substrate 11 approaches the controller 14. For this reason, the compression stress is generated in the connection portion between the first bump 32 and the first pad 25.

As described above, when the substrate 11 is bent upward, the tensile stress may be generated in the connection portion between the controller 14 and the first surface 21. However, the top cover 42 including the projection 64 is fixed to the housing 16, in contact with the controller 14 which is provided on the middle portion of the substrate 11 between the first screw 17A and the second screw 17B in the direction along the X-axis, and has the lower thermal expansion coefficient and the higher elasticity coefficient than the substrate 11. For this reason, when the substrate 11 is heated, the projection 64 and the controller 14 are held to be substantially at the same position. That is, if the substrate 11 moves upward, the projection 64 and the controller 14 restrict the mounted portion 61 from moving upward by pressing the mounted portion 61. For this reason, the change of the distance between the controller 14 and the first surface 21 of the substrate 11 due to the bent substrate 11 can be suppressed. Accordingly, the tensile stress is less likely to be generated in the connection portion between the controller 14 and the first surface 21 of the substrate 11 due to the bent substrate 11, and thus the connection portion is less likely to be damaged.

The projection 64 is in contact with the controller 14 having the lower thermal expansion coefficient and the higher elasticity coefficient than the substrate 11, and restricts the mounted portion 61 from moving upward. With this, the connection portion between the controller 14 and the first surface 21 of the substrate 11 is restricted from moving in the direction along the Z-axis. Accordingly, the tensile stress is less likely to be generated in the connection portion between the controller 14 and the first surface 21 of the substrate 11 due to the bent substrate 11, and thus the connection portion is damaged.

The projection 64 restricts the mounted portion 61 from moving in the direction along the Z-axis by pressing the substrate 11. With this, the damage to the connection portion between the controller 14 and the first surface 21 of the substrate 11 can be suppressed with a simpler structure.

The substrate 11 is bent so as to be projected downward in which the projection 64 is directed, and the projection 64 is in contact with the controller 14. In this way, the substrate 11 is bent, for example, under ordinary temperature. The direction in which the projection 64 presses the substrate 11 is opposite to the direction to which the substrate 11 tends to move by the thermal expansion. That is, the projection 64 causes the pressing force to act on the substrate 11 in the direction opposite to the direction to which the substrate 11 tends to move by the thermal expansion, and thus the force causing the substrate 11 to move due to the thermal expansion is cancelled by the pressing force. Accordingly, the tensile stress is less likely to be generated in the connection portion between the controller 14 and the first surface 21 of the substrate 11 due to the bent substrate 11, and thus the connection portion is less likely to be damaged.

The projection 64 is in contact with a portion of the controller 14 overlapping the first pad 25. With this, the connection portion between the first pad 25 provided on the substrate 11 and the first bump 32 of the controller 14 are restricted from moving in the direction along the Z-axis. Accordingly, the tensile stress is less likely to be generated in the connection portion between the first pad 25 and the first bump 32 due to the bent substrate 11, and thus the connection portion is less likely to be damaged.

The projection 64 is in contact with a portion of the controller 14 which overlaps one first pad 25 positioned at the end of the rows in the direction along the X-axis. The tensile stress is likely to be generated in the connection portion between the first pad 25 and the first bump 32 connected thereto. The projection 64 suppresses that the tensile stress is generated in the connection portion between the first pad 25 and the first bump 32 due to the bent substrate 11, and the connection portion is damaged.

The substrate 11 is thermally expanded by being heated, and generates a force directing upward, which is the direction along the Z-axis, on the mounted portion 61. In other words, the substrate 11 which is fixed by the screw 17 is thermally expanded by being heated and tends to move in the direction along the Z-axis so as to be bent. However, the projection 64 is in contact with the controller 14. Accordingly, the tensile stress is less likely to be generated the connection portion between the controller 14 and the first surface 21 of the substrate 11 due to the heated and bent substrate 11, and the connection portion is less likely to be damaged.

The SSD 10 according to the first embodiment as described above will be described in different expression. The SSD 10 includes the substrate 11, the bottom cover 41, and the top cover 42. The bottom cover 41 is an example of a first case. The top cover 42 is an example of a second case. The substrate 11 includes the first surface 21, and the second surface 22 which is on the side opposite to the first surface 21. The bottom cover 41 covers the second surface 22 of the substrate 11, and has the boss 52 to which the substrate 11 is fixed by the first screw 17A and the boss 52 to which the substrate 11 is fixed by the second screw 17B at a different position from the boss 52. The boss 52 to which the substrate 11 is fixed by the first screw 17A is an example of a first fixing portion. The boss 52 to which the substrate 11 is fixed by the second screw 17B is an example of a second fixing portion. The top cover 42 covers the first surface 21 of the substrate 11, and presses the first surface 21 of the substrate 11 by the projection 64 which is provided on the top cover 42 via the controller 14 in accordance with the connection to the bottom cover 41. Further, at least one portion of the substrate 11 which is positioned between the boss 52 to which the substrate 11 is fixed by the first screw 17A and the boss 52 to which the substrate 11 is fixed by the second screw 17B is displaced in accordance with the pressing force from the top cover 42.

Second Embodiment

Hereinafter, a second embodiment will be described with reference to FIG. 6. Here, in the following description for embodiments, previously described elements and elements having similar functions are described with reference numerals same as those of the previously described elements, and the description thereof may be omitted in some cases. In addition, a plurality of elements is described with the same reference numerals do not necessarily have the same functions and properties, but may have different functions and properties according to the respective embodiments.

Figure 6:
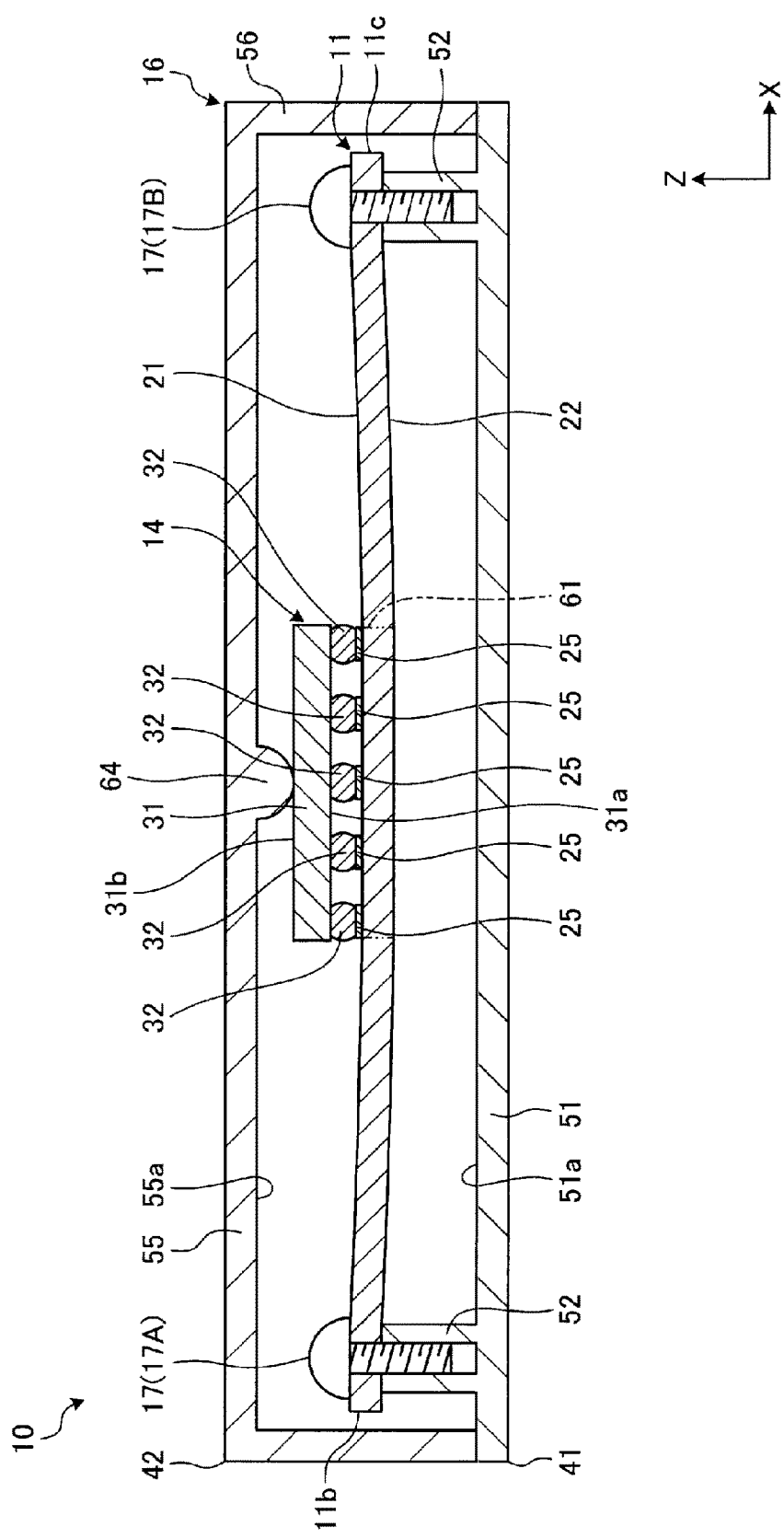
FIG. 6 is a cross-sectional view of an SSD according to a second embodiment.

FIG. 6 is a cross-sectional view of the SSD 10 according to the second embodiment. As illustrated in FIG. 6, the projection 64 of the SSD 10 according to the second embodiment is in contact with a portion of the controller 14 which overlaps the first pad 25 which is arranged at the center of the plurality of first pads 25 in the direction along the X-axis. In other words, one first pad 25 arranged at the center of the plurality of first pads 25 in the direction along the X-axis is arranged between the projection 64 of the top cover 42 and the first package 31, and the substrate 11 in the direction along the Z-axis.

As described above, the direction in which the force which is applied on the mounted portion 61 by the heated substrate 11 is determined by a difference between the coefficients of thermal expansion of the various portions of the substrate 11. For this reason, when the substrate 11 is heated, a force directing downward is applied on the mounted portion 61. In this case, it is likely that the tensile stress is generated in the connection portion between the first pad 25 arranged at the center of the rows in the plurality of first pads 25 which are arranged in the direction along the X-axis and the corresponding first bump 32, due to the bent substrate 11.

However, in the SSD 10 according to the present embodiment, the substrate 11 is bent so as to be projected downward by being pressed by the projection 64. A pressing force of the projection 64 which is applied on the substrate 11 is stronger than the force which causes the thermally expanded substrate 11 to be bent so as to be projected downward. For this reason, even when the substrate 11 is thermally expended, the substrate 11 is suppressed to be bent so as to be projected substantially downward. In this way, the projection 64 restricts a portion of the thermally expanded substrate 11 in which one first pad 25 which is arranged at the center of the plurality of first pads 25 in the direction along the X-axis is provided from moving downward.

Further, the projection 64 presses the corresponding first bump 32 to one first pad 25 which is arranged at the center of the plurality of first pads 25 in the direction along the X-axis. For this reason, the tensile stress is less likely to be generated in the connection portion between one first pad 25 which is arranged at the center of the plurality of first pads 25 in the direction along the X-axis and the corresponding first bump 32.

In the SSD 10 according to the second embodiment, the projection 64 presses the first bump 32 which is supposed to be separated from the first pad 25 by the heated substrate 11 toward the first pad 25 which is connected to the first bump 32 in the direction along the Z-axis. With this, the tensile stress is less likely to be generated in the connection portion between the first pad 25 and the first bump 32 due to the bent substrate 11, and thus the connection portion is damaged.

Third Embodiment

Figure 7:
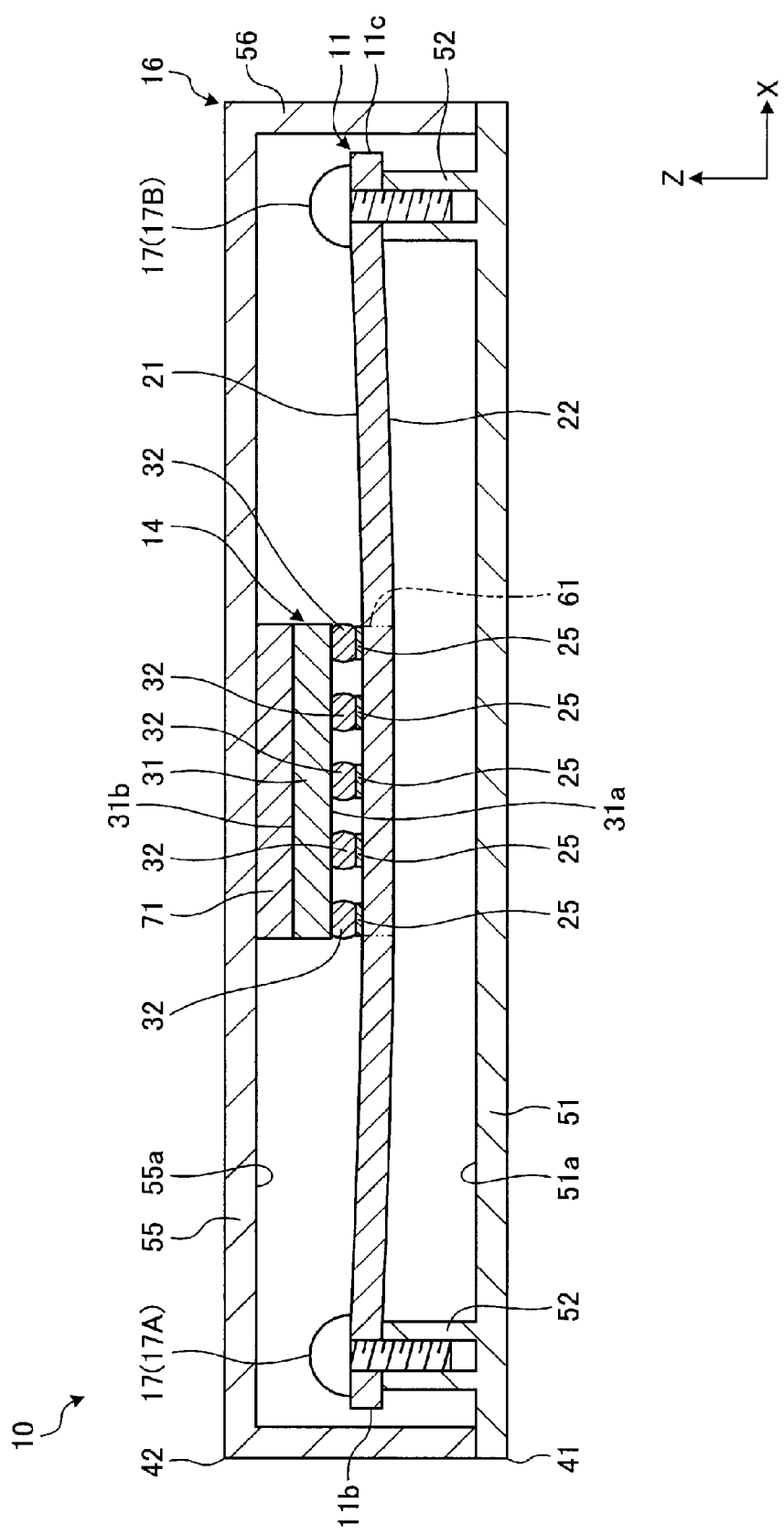
FIG. 7 is a cross-sectional view of an SSD according to a third embodiment.

Hereinafter, a third embodiment will be described with reference to FIG. 7. FIG. 7 is a cross-sectional view of the SSD 10 according to the third embodiment. As illustrated in FIG. 7, the top cover 42 according to the third embodiment includes a first plate 71 instead of the projection 64. The first plate 71 can be referred to as, for example, a pressing portion, a restraining portion, a supporting portion, or a member. In the present embodiment, the top cover 42 including the first plate 71 is an example of the contact portion.

The first plate 71 is formed of, for example, an aluminum alloy, but may be formed of another material such as a synthetic resin. The first plate 71 has a higher elasticity coefficient and a lower coefficient of thermal expansion than the substrate 11. The first plate 71 is the same as the first package 31 of the controller 14 when viewed from top in the direction along the Z-axis, or has a substantially flat quadrilateral plate shape and a size greater than the first package 31. The first plate 71 extends in the direction along the X-axis and the direction along the Y-axis.

The first plate 71 is attached to the second inner surface 55a of the second wall 55 through welding, for example. With this, the first plate 71 is fixed to the housing 16 without moving with respect to the housing 16.

The first plate 71 is in contact with the first top surface 31b of the first package 31 of the controller 14 downward. Expressed in another way, the first plate 71 is indirectly contact with the mounted portion 61 via the controller 14 from the direction along the Z-axis.

The first plate 71 presses the substrate 11 via the controller 14. The first plate 71 in the present embodiment presses the substrate 11 downward. The substrate 11 is bent so as to be projected downward by being pressed by the first plate 71.

A reaction force generated from the bent substrate 11 is applied on the first plate 71. However, the first plate 71 has the higher elasticity coefficient than the substrate 11. For this reason, the elastic deformation amount of the first plate 71 is considerably smaller than the elastic deformation amount of the substrate 11.

The first plate 71 is in contact with a portion of the controller 14 which overlaps all of the first pads 25 downward. In other words, all of the first pads 25 are positioned between the first plate 71 and the first package 31, and the substrate 11 in the direction along the Z-axis. Meanwhile, at least one of the first pads 25 may be at a position deviated from the first plate 71 in the direction along the Z-axis.

The first plate 71 as described above restricts the mounted portion 61 of the thermally expanded substrate 11 from moving upward. Further, the first plate 71 restricts a portion of the thermally expanded substrate 11 in which all of the first pads 25 are provided from moving upward.

In the SSD 10 according to the third embodiment, the first plate 71 restricts a portion of the thermally expanded substrate 11 in which the plurality of first pads 25 are provided from moving upward. With this, that the tensile stress is less likely to be generated in the connection portion between the plurality of first pads 25 and the plurality of first bumps 32 due to the bent substrate 11, and thus the connection portion is damaged.

The SSD 10 according to the third embodiment described above will be described in different expression. The SSD 10 includes the substrate 11, the bottom cover 41, and the top cover 42. The substrate 11 includes the first surface 21, and the second surface 22 which is on the side opposite to the first surface 21. The bottom cover 41 covers the second surface 22 of the substrate 11, and has the boss 52 to which the substrate 11 is fixed by the first screw 17A and the boss 52 to which the substrate 11 is fixed by the second screw 17B at a different position from the boss 52. The top cover 42 covers the first surface 21 of the substrate 11, and presses the first surface 21 of the substrate 11 via the first plate 71 and the controller 14 in accordance with the connection to the bottom cover 41. Further, the first plate 71 is provided between the top cover 42 and the substrate 11, and at least one portion of the substrate 11 which is positioned between the boss 52 to which the substrate 11 is fixed by the first screw 17A and the boss 52 to which the substrate 11 is fixed by the second screw 17B at a different position from the boss 52 is displaced in accordance with the pressing force from the first plate 71. The first plate 71 is an example of the contact portion.

Fourth Embodiment

Figure 8:
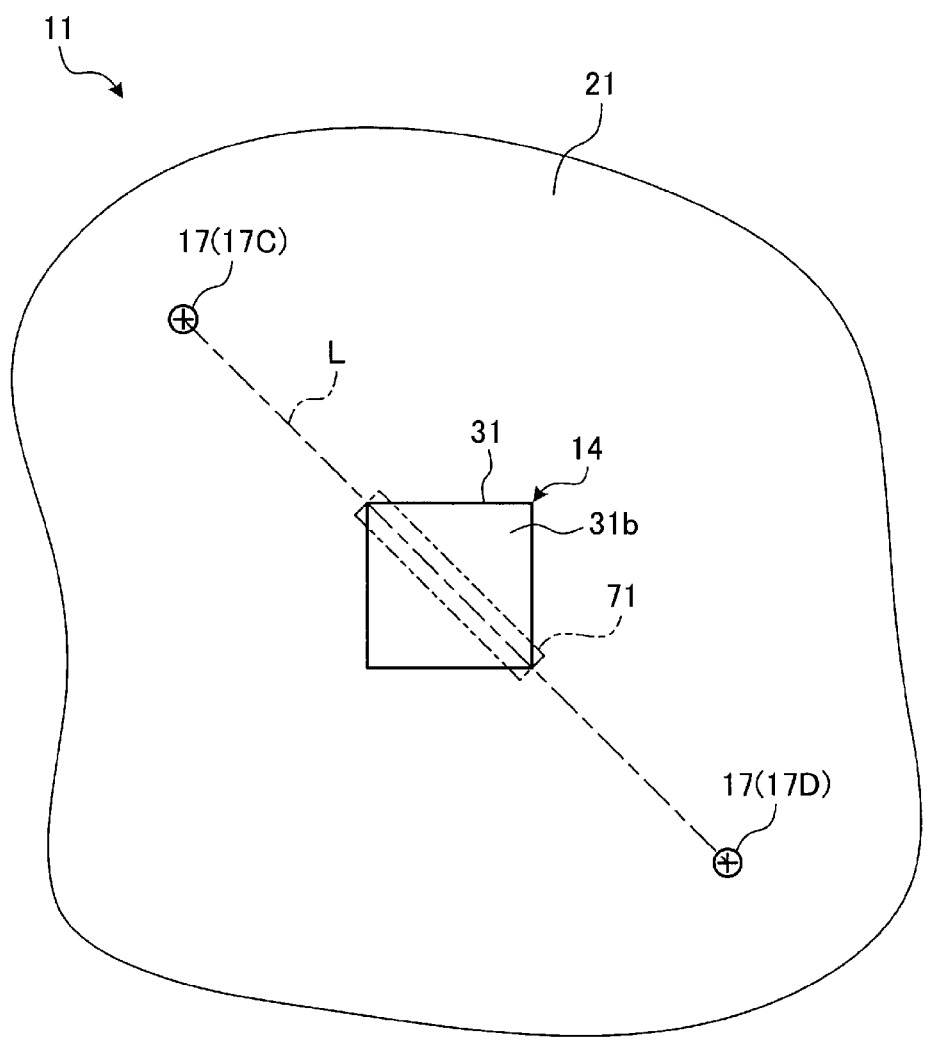
FIG. 8 is a plane view of a portion of a substrate according to a fourth embodiment.

Hereinafter, a fourth embodiment will be described with reference to FIG. 8. FIG. 8 is a plane view of a portion of the substrate 11 according to the fourth embodiment. FIG. 8 illustrates the first plate 71 by a two-dot chain line. A shape of the first plate 71 according to the fourth embodiment is different from the shape of the first plate 71 according to the third embodiment.

As illustrated in FIG. 8, the screw 17 in the fourth embodiment includes the third screw 17C and the fourth screw 17D. The third screw 17C is an example of the first fixing member. The fourth screw 17D is an example of the second fixing member.

The third screw 17C fixes the substrate 11 to the housing 16. The fourth screw 17D fixes the substrate 11 to the housing 16 at a position different from the third screw 17C. For example, the third screw 17C fixes the second end portion 11b of the substrate 11 to the housing 16. The fourth screw 17D fixes, for example, the third end portion 11c of the substrate 11 to the housing 16.

The third screw 17C and the fourth screw 17D are aligned along an imaginary line L. FIG. 8 illustrates the imaginary line L by a dashed line. The imaginary line L extends in the direction which obliquely intersects with each of the X-axis and the Y-axis. The fourth screw 17D is separated from the third screw 17C in the direction in which the imaginary line L extends. The direction in which the imaginary line L extends is an example of the first direction in the present embodiment. Meanwhile, an example of the first direction includes a direction along the imaginary line (includes the imaginary line L and an imaginary line which is different from the imaginary line L) which connects one point of the third screw 17C and one point of the fourth screw 17D when the substrate 11 is viewed from top, but do not include a direction orthogonal to the imaginary line L which connects the center of each of the third screw 17C and the fourth screw 17D.

The controller 14 is arranged on the imaginary line L toward the fourth screw 17D from the third screw 17C. In other words, the controller 14 is provided in the middle portion of the substrate 11 between the third screw 17C and the fourth screw 17D in the direction along the imaginary line L. The imaginary line L obliquely crosses the controller 14. Meanwhile, the position of the controller 14 in the present embodiment is not limited, and for example, the position between the third screw 17C and the fourth screw 17D may be deviated in the direction along the imaginary line L. That is, when the substrate 11 is viewed from top, the middle portion of the substrate 11 between the third screw 17C and the fourth screw 17D in the direction along the imaginary line L includes a portion which is deviated to the direction orthogonal to the imaginary line L from the imaginary line L, but do not include a portion which is deviated from an area between the third screw 17C and the fourth screw 17D in the direction along the imaginary line L.

The first plate 71 in the fourth embodiment extends in the direction along the imaginary line L. For this reason, the first plate 71 is in contact with a portion of the controller 14 which overlaps one first pad 25 arranged at a corner of the matrix and the first pad 25 which is positioned on a diagonal line of the first pad 25.

In the SSD 10 according to the fourth embodiment, the controller 14 is provided in the middle portion of the substrate 11 between the third screw 17C and the fourth screw 17D in the direction along the imaginary line L. The substrate 11 which is fixed by the third screw 17C and the fourth screw 17D tends to be bent so as to be projected in the direction orthogonal to the imaginary line L when the substrate 11 is thermally expanded, for example. However, the first plate 71 extends in the direction along the imaginary line L. For this reason, the substrate 11 is less likely to be bent, and the connection portion between the controller 14 and the first surface 21 of the substrate 11 is damaged.

Fifth Embodiment

Figure 9:
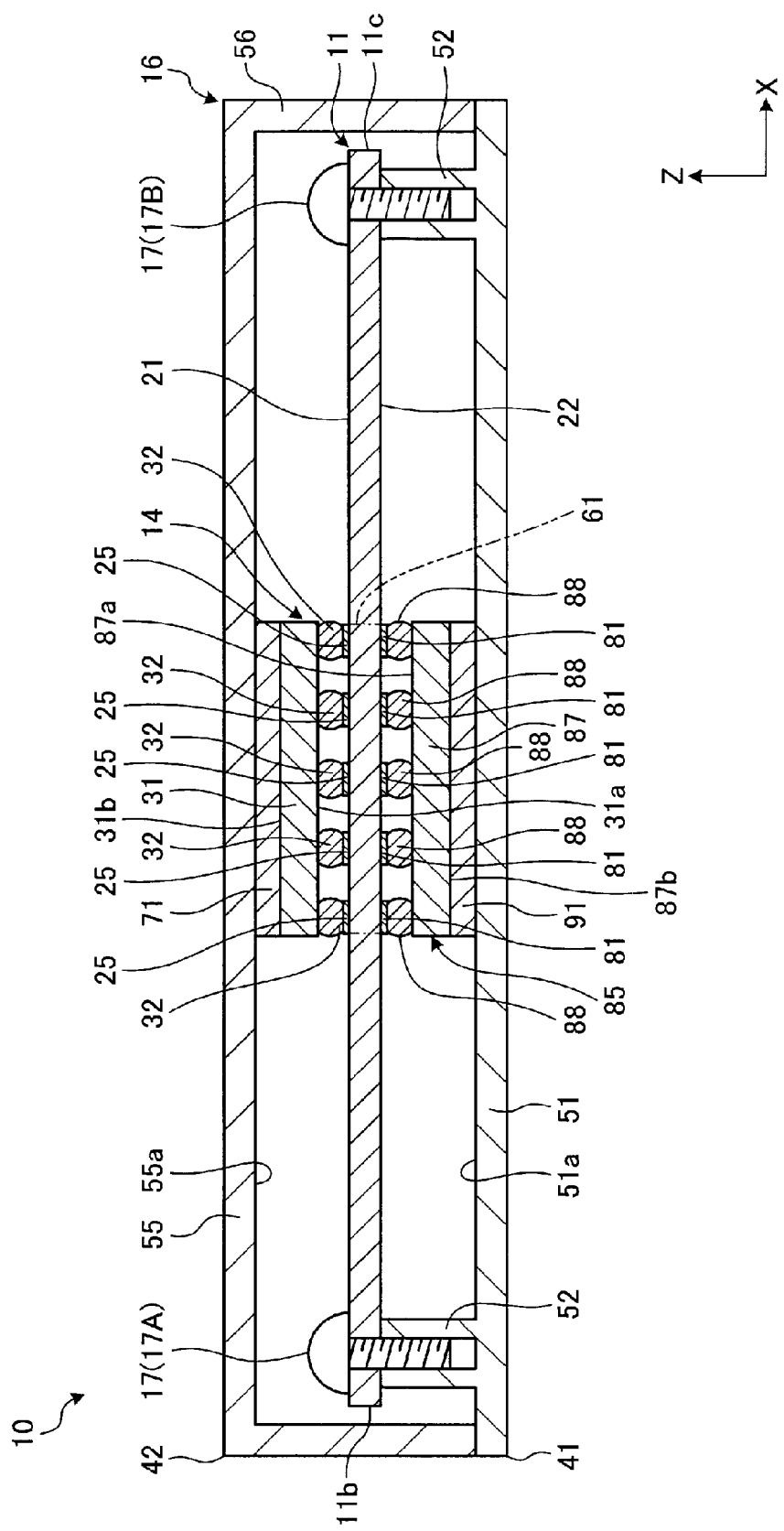
FIG. 9 is a cross-sectional view of an SSD according to a fifth embodiment.

Hereinafter, a fifth embodiment will be described with reference to FIG. 9. FIG. 9 is a cross-sectional view of the SSD 10 according to the fifth embodiment. Various electronic components are mounted on two sides of the substrate 11 in the fifth embodiment.

As illustrated in FIG. 9, a plurality of the second pads 81 is provided on the second surface 22 of the substrate 11. The plurality of the second pads 81 is, for example, arranged in a matrix shape. For example, a group of second pads 81 is arranged in the direction along the X-axis, and a plurality of the group is arranged in the direction along the Y-axis. In other words, a group of the second pads 81 is arranged in the direction along the Y-axis, and a plurality of the groups is arranged in the direction along the X-axis.

A ball grid array (BGA) 85 is mounted on the second surface 22 of the substrate 11. In other words, the BGA 85 is attached to the second surface 22 and electrically connected to a circuit on the substrate 11. The BGA 85 is an example of a member having a lower thermal expansion coefficient and a higher elasticity coefficient than the second electronic component and the substrate, and can be referred to as, for example, a component or a source of heat. Meanwhile, the second electronic component may be another electronic component. The BGA 85 includes a second package 87 and a plurality of second solder bumps (hereinafter, referred to as a second bump) 88. When the BGA 85 is considered as one member, the BGA 85 has a lower thermal expansion coefficient and a higher elasticity coefficient than the substrate 11.

The second package 87 includes, for example, a circuit board, a plurality of electronic components mounted on the circuit board, and a sealing resin which accommodates the circuit board and the plurality of electronic components. The second package 87 includes a second bottom surface 87a and a second top surface 87b. The second bottom surface 87a and the second top surface 87b are substantially directed to the direction along the Z-axis. The second bottom surface 87a is directed upward and to the second surface 22 of the substrate 11. The second top surface 87b is directed downward and arranged on the side opposite to the second bottom surface 87a.

The plurality of second bumps 88 is arranged on the second bottom surface 87a of the second package 87. Each of the plurality of second bumps 88 is attached to the plurality of electrodes of the BGA 85 which is provided on the second bottom surface 87a.

The plurality of second bumps 88 corresponds to the plurality of the second pads 81 and, for example, is arranged in a matrix shape. For example, a group of second bumps 88 is arranged in the direction along the X-axis, and a plurality of the groups is arranged in the direction along the Y-axis. In other words, a group of second bumps 88 is arranged in the direction along the Y-axis, and a plurality of the groups is arranged in the direction along the X-axis. Each of the second bumps 88 is connected to the corresponding one of the second pads 81. In other words, the electrode of the BGA 85 is soldered to the second pad 81 by the second bump 88. As a result, the BGA 85 is mounted on the second surface 22.

The plurality of the second pads 81 is provided in the mounted portion 61 similarly to the plurality of first pads 25. For this reason, the BGA 85 overlaps the controller 14 in the direction along the Z-axis. That is, the plurality of the second pads 81 is provided in the middle portion of the substrate 11 between the first screw 17A and the second screw 17B in the direction along the X-axis. For this reason, the BGA 85 is provided in the middle portion of the substrate 11 between the first screw 17A and the second screw 17B in the direction along the X-axis. Meanwhile, a portion of the BGA 85 may overlap the controller 14 in the direction along the Z-axis. In addition, each of the second pads 81 overlaps the corresponding one of the first pads 25 in the direction along the Z-axis.

The bottom cover 41 according to the fifth embodiment includes a second plate 91. The second plate 91 can be referred to as a pressing portion, a restraining portion, a supporting portion, or a member. In the present embodiment, the bottom cover 41 including the second plate 91 is an example of the second member.

The second plate 91 is formed of, for example, an aluminum alloy, but may be formed of another material such as a synthetic resin. The second plate 91 has a higher elasticity coefficient and a lower thermal expansion coefficient than the substrate 11. The second plate 91 is the same as the second package 87 of the BGA 85 when viewed from top in the direction along the Z-axis, or has a substantially flat quadrilateral plate shape and a size greater than the second package 87. The second plate 91 extends in the direction along the X-axis and the direction along the Y-axis.

The second plate 91 is attached to the first inner surface 51a of the first wall 51 through welding, for example. With this, the second plate 91 is fixed to the housing 16 without moving with respect to the housing 16.

The second plate 91 is in contact with the second top surface 87b of the second package 87 of the BGA 85. Expressed in another way, the second plate 91 is indirectly contact with the mounted portion 61 via the BGA 85 and connected in the direction along the Z-axis.

On the other hand, as same in the third embodiment, the first plate 71 is in contact with the first top surface 31b of the first package 31 of the controller 14. In the present embodiment, the top cover 42 including the first plate 71 is an example of the first member.

The first plate 71 presses the substrate 11 via the controller 14 downward. The second plate 91 presses the substrate 11 via the BGA 85 upward. The substrate 11 is pressed by the first plate 71 and the second plate 91, and thus is held to be substantially straight. Here, the substrate 11 may be bent so as to be projected downward.

A reaction force caused by the pressed substrate 11 is applied to the second plate 91. However, the second plate 91 has the higher elasticity coefficient than the substrate 11. Further, the BGA 85 has the higher elasticity coefficient than the substrate 11. For this reason, the elastic deformation amount of the second plate 91 and the BGA 85 is considerably smaller than the elastic deformation amount of the substrate 11.

The second plate 91 is in contact with a position of the BGA 85 which overlaps all of the second pads 81. In other words, all of the second pads 81 are positioned between the second plate 91 and the second package 87, and the substrate 11, in the direction along the Z-axis. Meanwhile, at least one of the second pads 81 may be at a position deviated from the second plate 91 in the direction along the Z-axis.

When the substrate 11 in the present embodiment is heated, a force directing upward is applied on the mounted portion 61. However, the first plate 71 is in contact with the controller 14. Further, the second plate 91 is in contact with the BGA 85. For this reason, the first plate 71 and the second plate 91 hold the mounted portion 61, and restrict the mounted portion 61 of the thermally expanded substrate 11 from moving upward.

On the other hand, when the substrate 11 is cooled, a force directing downward is applied on the mounted portion 61. However, the second plate 91 is in contact with the BGA 85. Further, the first plate 71 is in contact with the controller 14. For this reason, the first plate 71 and the second plate 91 hold the mounted portion 61, and restrict the mounted portion 61 of the thermally expanded substrate 11 from moving downward.

In the SSD 10 according to the fifth embodiment, the top cover 42 including the first plate 71 is in contact with the controller 14 which is provided on the middle portion of the substrate 11 between the first screw 17A and the second screw 17B in the direction along the X-axis. The bottom cover 41 including the second plate 91 is in contact with the BGA 85 which is provided in the middle portion of the substrate 11 upward. That is, the substrate 11 is pressed by the first plate 71 from the side of the first surface 21 and is pressed by the second plate 91 from the side of the second surface 22. Accordingly, the mounted portion 61 is held more firmly, the tensile stress is less likely to be generated in the connection portion between the controller 14 and the first surface 21 of the substrate 11 due to the bent substrate 11, and thus the connection portion is less likely to be damaged.

Meanwhile, in the present embodiment, the bottom cover 41 including the second plate 91 is an example of the second member, and the top cover 42 including the first plate 71 is an example of the first member. However, the top cover 42 having the projection 64 may be an example of the first member. Further, the bottom cover 41 which has the projection instead of the second plate 91 may be an example of the second member.

Sixth Embodiment

Figure 10:
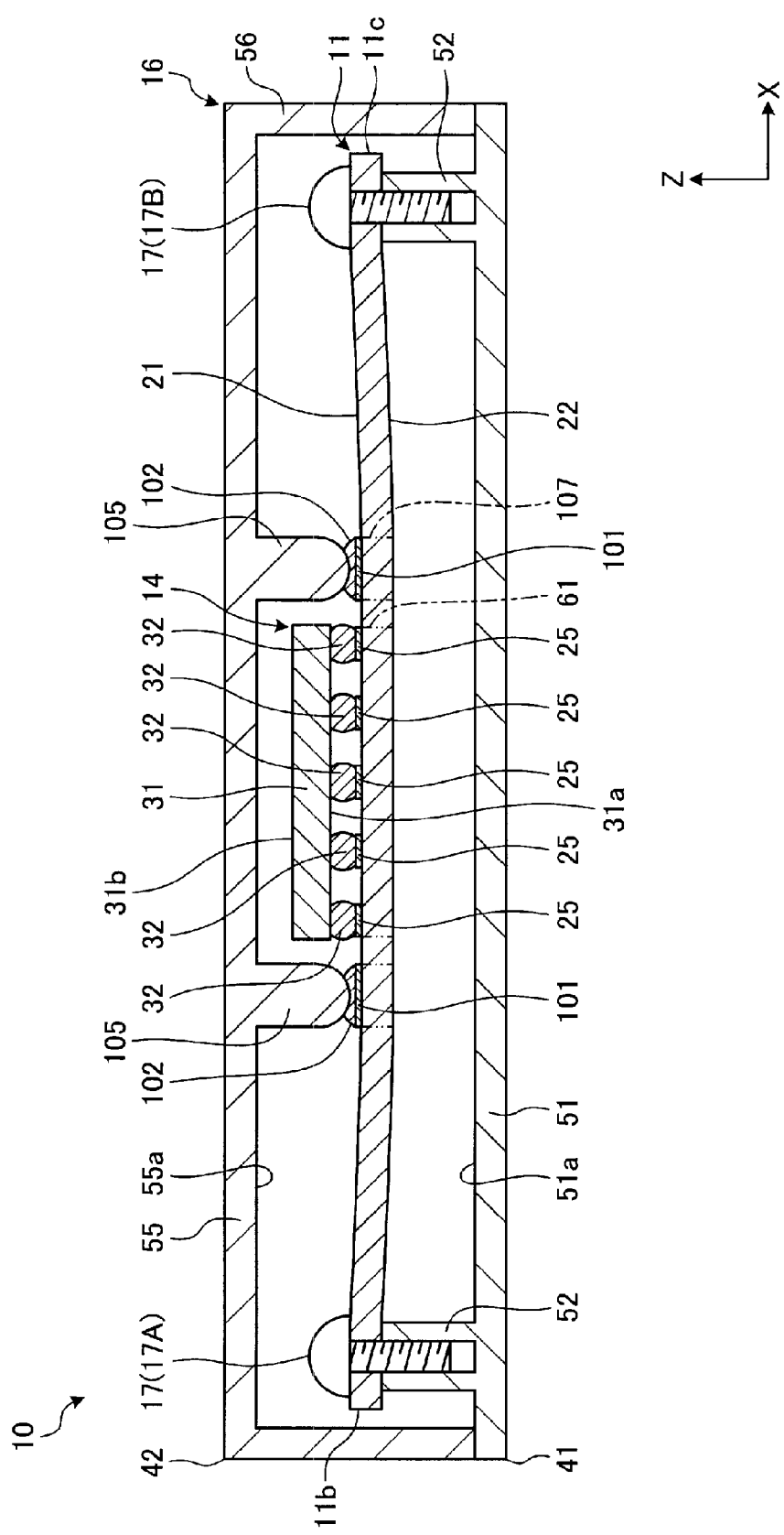
FIG. 10 is a cross-sectional view of an SSD according to a sixth embodiment.

Hereinafter, a sixth embodiment will be described with reference to FIG. 10. FIG. 10 is a cross-sectional view of the SSD 10 according to the sixth embodiment. The substrate 11 according to the sixth embodiment is same as the first to fourth embodiments, and various electronic components are mounted on one side of the substrate 11.

As illustrated in FIG. 10, a plurality of third pads 101 is provided on the first surface 21 of the substrate 11. Each of the third pads 101 is provided in the vicinity of the plurality of first pads 25. The third pad 101 is closer to the controller 14 than the screw 17 is. The third pad 101 is provided in the middle portion of the substrate 11 between the first screw 17A and the second screw 17B in the direction along the X-axis. The third pad 101 is independently arranged by being disconnected from a circuit which is provided on the substrate 11.

Among the plurality of third pads 101, some of the third pads 101 are arranged between the plurality of first pads 25 which are arranged in the matrix shape and the first screw 17A, and are arranged in the direction along the Y-axis. Among the plurality of third pads 101, some of the third pads 101 are arranged between the plurality of first pads 25 which are arranged in the matrix shape and the second screw 17B, and are arranged in the direction along the Y-axis. Among the plurality of third pads 101, some of the third pads 101 are arranged in a position which is separated from the plurality of first pads 25 which are arranged in the matrix shape in the direction along the Y-axis, and are arranged in the direction along the X-axis. That is, the plurality of third pads 101 is arranged in a frame shape which surrounds the plurality of first pads 25 arranged in the matrix shape.

A first solder 102 is attached to each of the plurality of third pads 101. In other words, the first solder 102 is provided on the first surface 21 in the middle portion of the substrate 11 between the first screw 17A and the second screw 17B in the direction along the X-axis. The first solder 102 has the lower thermal expansion coefficient and the higher elasticity coefficient than the substrate 11.

Instead of the projection 64, a plurality of first contact portions 105 may be provided on the second wall 55 of the top cover 42 in the sixth embodiment. The first contact portion 105 can be referred to as, for example, a pressing portion, a restricting portion, a restraining portion, a supporting portion, or a portion. In the present embodiment, the top cover 42 having the plurality of first contact portions 105 is an example of the contact portion. Each of the plurality of first contact portions 105 is projected to the first solder 102 on the first surface 21 of the substrate 11 from the second inner surface 55a of the second wall 55.

The first contact portion 105 is integrally formed with the second wall 55. For this reason, the first contact portion 105 is fixed to the housing 16 without moving with respect to the housing 16. Further, the first contact portion 105 has a lower thermal expansion coefficient and a higher elasticity coefficient than the substrate 11. Here, the first contact portion 105 may be separately formed from the second wall 55.

Each of the plurality of first contact portions 105 is in contact with the first solder 102. Expressed in another way, the first contact portion 105 is indirectly contact with a portion (hereinafter, referred to as a peripheral portion) 107 of the substrate 11 which is in the periphery of the mounted portion 61 via the first solder 102 from the direction along the Z-axis. The peripheral portion 107 is a portion which is closer to the controller 14 further than the screw 17 of the substrate 11 is, and is a portion in the periphery of the mounted portion 61 of the substrate 11. FIG. 10 illustrates the peripheral portion 107 by a two-dot chain line.

The peripheral portion 107 in the present embodiment is a portion of the substrate 11 which overlaps an area of the third pad 101 in a frame shape which is surrounded by an internal tangent line and an external tangent line which is arranged in a frame shape in the direction along the Z-axis. The peripheral portion 107 includes a portion of the substrate 11 which has the third pad 101. In the present embodiment, the portion of the substrate 11 which has the third pad 101 is a portion of the substrate 11 which overlaps the third pad 101 in the direction along the Z-axis.

The first contact portion 105 presses the substrate 11 via the first solder 102. The first contact portion 105 in the present embodiment presses the substrate 11 downward. When the first contact portion 105 presses the substrate 11, the substrate 11 is bent so as to be projected downward.

A reaction force caused by the bent substrate 11 is applied on the top cover 42 and the first solder 102. However, the bottom cover 41 and the top cover 42 have the higher elasticity coefficient than the substrate 11. In addition, the first solder 102 has the higher elasticity coefficient than the substrate 11. For this reason, the elastic deformation amount of the top cover 42 including the first contact portion 105 and the first solder 102 is considerably smaller than the elastic deformation amount of the substrate 11.

As described above, when the substrate 11 is heated, a force directing upward is applied on the mounted portion 61. The thermally expanded substrate 11 also applies a force directing upward on the peripheral portion 107.

In the SSD 10 in the present embodiment, the first contact portion 105 of the top cover 42 is in contact with the first solder 102. For this reason, the first contact portion 105 restricts the peripheral portion 107 of the thermally expanded substrate 11 from moving upward.

The force directing upward which is applied on the peripheral portion 107 by the substrate 11 is applied on the top cover 42. However, the bottom cover 41 and the top cover 42 have the higher elasticity coefficient than the substrate 11. Further, the thermal expansion coefficient of the top cover 42 including the first contact portion 105 is lower than the thermal expansion coefficient of the substrate 11. For this reason, in the direction along the Z-axis, a position of the first contact portion 105 of the thermally expanded top cover 42 is substantially the same as the position of the first contact portion 105 of the top cover 42 before being thermally expanded. Further, the first solder 102 has the higher elasticity coefficient and the lower thermal expansion coefficient than the substrate 11. For this reason, in the direction along the Z-axis, the position of the thermally expanded first solder 102 is substantially the same as the position of the first solder 102 before being thermally expanded. The first contact portion 105 which is at the position which is substantially the same before being thermally expanded, presses the substrate 11 via the first solder 102 which is substantially at the same position as before being thermally expanded, and holds the peripheral portion 107 to be substantially at the same position as before being thermally expanded. Here, the position of the first contact portion 105 is not limited thereto.

As described above, the first contact portion 105 restricts the peripheral portion 107 of the thermally expanded substrate 11 from moving upward. For this reason, in the thermally expanded substrate 11, a portion of the inside of the peripheral portion 107 is likely to be bent so as to be projected upward. In the substrate 11, the portion of the inside of the peripheral portion 107 is a portion which overlaps an area between the internal tangent line of the third pad 101 which is arranged between the mounted portion 61 and the first screw 17A and internal tangent of line the third pad 101 which is arranged between the mounted portion 61 and the second screw 17B, in the direction along the Z-axis.

The inside portion of the peripheral portion 107 includes the mounted portion 61. For this reason, when the inside portion of the peripheral portion 107 is bent so as to be projected upward, the tensile stress is generated in the connection portion between the first pad 25 and the first bump 32.

However, in the direction along the X-axis, the length of the inside portion of the peripheral portion 107 is shorter than the distance between the first screw 17A and the second screw 17B. For this reason, even when the inside portion of the peripheral portion 107 is bent so as to be projected upward, the tensile stress is less likely to be generated in the connection portion between the first pad 25 and the first bump 32.

Further, the substrate 11 is bent so as to be projected downward from the first contact portion 105. A pressing force of the first contact portion 105 which is applied on the substrate 11 is stronger than the force which causes the inside portion of the peripheral portion 107 of the thermally expanded substrate 11 to be bent so as to be projected upward. For this reason, the first contact portion 105 holds the inside portion of the peripheral portion 107 to be in a state of being bent so as to be projected downward. Accordingly, the tensile stress is less likely to be generated in the connection portion between the first pad 25 and the first bump 32.

The first solder 102 is pressed by the first contact portion 105. The elasticity coefficient of the first solder 102 is lower than the elasticity coefficient of the first contact portion 105. For this reason, the first solder 102 is compressed. However, the first solder 102 has the higher elasticity coefficient than the substrate 11, and thus restricts the substrate 11 from moving in the direction along the Z-axis.

In the SSD 10 in the sixth embodiment, the first contact portion 105 is in contact with the first solder 102 which is provided on the first surface 21 in the middle portion of the substrate 11 between the first screw 17A and the second screw 17B in the direction along the X-axis, downward. The top cover 42 which has the first contact portion 105 restricts the peripheral portion 107 from moving in the direction along the Z-axis. That is, the first solder 102 is interposed between the first contact portion 105 and the substrate 11. Accordingly, the first contact portion 105 more reliably is in contact with the substrate 11 via the first solder 102, and thus the connection portion between the first pad 25 and the first bump 32 is less likely to be damaged. Further, when the first contact portion 105 is not in contact with the controller 14, but is in contact with the first solder 102 on the substrate 11, even when dimension tolerance in the periphery of the controller 14 is set to be small, the first contact portion 105 can be provided and an outer force applied on the controller 14 can be suppressed. Therefore, reliability of the SSD 10 is improved.

The SSD 10 in the sixth embodiment as described above will be described in different expression. The SSD 10 includes the substrate 11, the bottom cover 41, and the top cover 42. The substrate 11 includes the first surface 21 and the second surface 22 which is on the side opposite to the first surface 21. The bottom cover 41 covers the second surface 22 of the substrate 11, and has the boss 52 to which the substrate 11 is fixed by the first screw 17A and the boss 52 to which the substrate 11 is fixed by the second screw 17B at a different position from the boss 52. The top cover 42 covers the first surface 21 of the substrate 11, and presses the first surface 21 of the substrate 11 by the first contact portion 105 which is provided on the top cover 42 via the first solder 102 in accordance with the bottom cover 41. Further, at least one portion of the substrate 11 which is positioned between the boss 52 to which the substrate 11 is fixed by the first screw 17A and the boss 52 to which the substrate 11 is fixed by the second screw 17B is displaced in accordance with the pressing force from the top cover 42.

Seventh Embodiment

Figure 11:
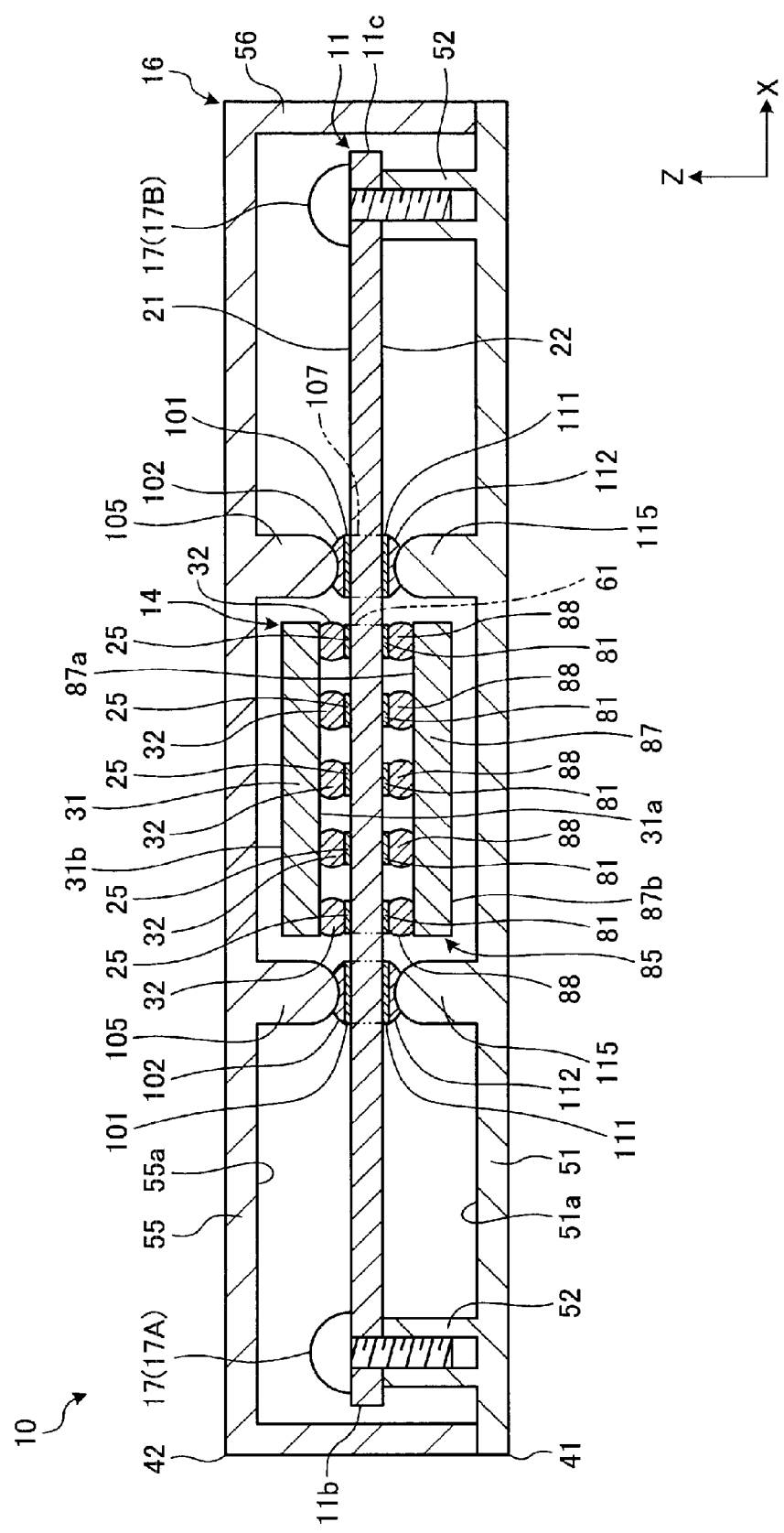
FIG. 11 is a cross-sectional view of an SSD according to a seventh embodiment.

Hereinafter, a seventh embodiment will be described with reference to FIG. 11. FIG. 11 is a cross-sectional view of the SSD 10 according to the seventh embodiment. The substrate 11 according to the seventh embodiment is same as the one according to the fifth embodiment, and various electronic components are mounted on both sides of the substrate 11. The BGA 85 is mounted on the second surface 22 of the substrate 11.

As illustrated in FIG. 11, a plurality of fourth pads 111 is provided on the second surface 22 of the substrate 11. Each of the fourth pads 111 is provided in the vicinity of the plurality of the second pads 81. The fourth pad 111 is closer to the controller 14 than the screw 17 is. The fourth pad 111 is provided in the middle portion of the substrate 11 between the first screw 17A and the second screw 17B in the direction along the X-axis. The fourth pad 111 is independently arranged by being disconnected from a circuit on the substrate 11.

The fourth pad 111 is provided in the peripheral portion 107. For this reason, the fourth pad 111 overlaps the third pad 101 in the direction along the Z-axis. A portion of the fourth pad 111 may overlap the third pad 101 in the direction along the Z-axis.

A second solder 112 is attached to each of the plurality of fourth pads 111. In other words, the second solder 112 is provided on the second surface 22 in the middle portion of the substrate 11 between the first screw 17A and the second screw 17B in the direction along the X-axis. The second solder 112 has the lower thermal expansion coefficient and the higher elasticity coefficient than the substrate 11.

Instead of the second plate 91, a plurality of second contact portions 115 is provided on the first wall 51 of the bottom cover 41 in the seventh embodiment. The second contact portion 115 can be referred to as, for example a pressing portion, a restricting portion, a restraining portion, a supporting portion, or a portion. In the present embodiment, the top cover 42 which has the plurality of second contact portions 115 is an example of the second member. Each of the plurality of second contact portions 115 is projected to the second solder 112 which is provided on the second surface 22 of the substrate 11 from the first inner surface 51a of the first wall 51.

The second contact portion 115 is integrally formed with the first wall 51. For this reason, the second contact portion 115 is fixed to the housing 16 without moving with respect to the housing 16. Further, the second contact portion 115 has the lower thermal expansion coefficient and the higher elasticity coefficient than the substrate 11. Here, the second contact portion 115 may be separately formed from the first wall 51.

Each of the plurality of second contact portions 115 is in contact with one of the second solders 112. Expressed in another way, the second contact portion 115 is indirectly in contact with the peripheral portion 107 via the second solder 112 from the direction along the Z-axis.

The second contact portion 115 presses the substrate 11 via the second solder 112 upward. The substrate 11 presses the first contact portion 105 and the second contact portion 115, and thus is held to be substantially straight. Here, the substrate 11 may be bent so as to be projected downward.

When the substrate 11 in the present embodiment is heated, a force directing upward is applied on the mounted portion 61 and the peripheral portion 107. However, the first contact portion 105 is in contact with the first solder 102. Further, the second contact portion 115 is in contact with the second solder 112. For this reason, the first contact portion 105 and the second contact portion 115 hold the peripheral portion 107, and restrict the peripheral portion 107 of the thermally expanded substrate 11 from moving upward.

On the other hand, when the substrate 11 is cooled, a force directing downward is applied on the mounted portion 61 and the peripheral portion 107. However, the second contact portion 115 is in contact with the second solder 112. Further, the first contact portion 105 is in contact with the first solder 102d. For this reason, the first contact portion 105 and the second contact portion 115 hold the peripheral portion 107 and restrict the peripheral portion 107 of the thermally expanded substrate 11 from moving downward.

In the SSD 10 according to the seventh embodiment, the first contact portion 105 is in contact with the first solder 102 in the middle portion of the substrate 11 between the first screw 17A and the second screw 17B in the direction along the X-axis. The second contact portion 115 is in contact with the second solder 112 in the middle portion of the substrate 11. That is, the substrate 11 is pressed by the first contact portion 105 from the side of the first surface 21 and by the second contact portion 115 from the side of the second surface 22. Accordingly, the mounted portion 61 is held more firmly. As a result, the tensile stress is less likely to be generated in the connection portion between the controller 14 and the first surface 21 of the substrate 11 due to the bent substrate 11, and thus the connection portion is less likely to be damaged.

The first contact portion 105 may directly is in contact with the middle portion of the substrate 11 between the first screw 17A and the second screw 17B in the direction along the X-axis. In addition, the second contact portion 115 may directly is in contact with the middle portion of the substrate 11.

According to at least one embodiment as described above, the contact portion which has the lower thermal expansion coefficient and the higher elasticity coefficient than the substrate is in contact with the middle portion of the substrate between the first fixing member and the second fixing member in the first direction, or is in contact with a member which is provided in the middle portion and has the lower thermal expansion coefficient and the higher elasticity coefficient than the substrate in the second direction toward from the first surface to the second surface of the substrate. Accordingly, the connection portion between the first electronic component and the first surface of the substrate is less likely to be damaged.

At least one embodiment as described above does not include an electronic device which includes a spring that is elastically in contact with an electronic component, or an electronic device which has the higher thermal expansion coefficient and (or) the lower elasticity coefficient than the substrate, for example, an electronic device in which a thermal conducting sheet is in contact with an electronic component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the restricting portion is not limited to the projection 64, the first plate 71, and the second plate 91. For example, the restricting portion may be a claw which is hooked by at least one of the first surface 21 and the second surface 22 of the substrate 11 so as to restrict the first substrate 11 from moving in the direction along the Z-axis.

What is claimed is:

1. A semiconductor device, comprising:
a housing;
a substrate housed in and fixed to the housing; and
a semiconductor module package disposed on a surface of the substrate, wherein
a protrusion is formed on the housing and protruding towards the substrate, wherein the protrusion is located adjacent to the semiconductor module package, and is in contact with a surface of the semiconductor module package to support the semiconductor module package against an urging force by the substrate.

2. The semiconductor device according to claim 1, wherein
the housing includes a first housing member and a second housing member coupled to the first housing member,
the substrate is fixed to the first housing member, and
the protrusion is formed on the second housing member.

3. The semiconductor device according to claim 1, wherein
the protrusion is integrally formed with a base portion of the housing.

4. The semiconductor device according to claim 1, wherein
the substrate has a higher thermal expansion coefficient and a lower elasticity coefficient than the protrusion.

5. The semiconductor device according to claim 1, wherein
the substrate has a higher thermal expansion coefficient and a lower elasticity coefficient than the semiconductor module package.

6. The semiconductor device according to claim 1, further comprising:
a plurality of semiconductor memory modules disposed on the substrate, and
a memory controller configured to control the plurality of semiconductor memory modules.

7. The semiconductor device according to claim 1, wherein
the substrate is curved in a direction away from the protrusion, when the semiconductor module package is not generating heat.

8. The semiconductor device according to claim 7, wherein
the substrate is fixed to the housing, so as to press against the protrusion, when the semiconductor module package generates heat.

9. The semiconductor device according to claim 1, wherein
the semiconductor module package is electrically connected to the substrate through a plurality of electrodes disposed on the substrate, and
the protrusion is located at a position facing at least one of the electrodes.

10. The semiconductor device according to claim 9, wherein
the electrode facing the protrusion is located at a position corresponding to an edge portion of the semiconductor module package.

11. The semiconductor device according to claim 1, wherein
the substrate is fixed to the housing with a plurality of fixing members including first and second fixing members, and
the protrusion is positioned between the first fixing member and the second fixing member in a surface direction along a surface of the substrate, and has a shape extending in the surface direction.

12. The semiconductor device according to claim 1, further comprising:

a second semiconductor module package disposed on a second surface of the substrate opposite to the surface on which the semiconductor module package is disposed, wherein a second protrusion is also formed on the housing and protruding towards the substrate, the second protrusion being located adjacent to the second semiconductor module package and directly or indirectly urging the substrate in a direction away from the second protrusion.

13. A semiconductor device, comprising:

a housing;

a substrate housed in and fixed to the housing; and a semiconductor module package disposed on a surface of the substrate, wherein a protrusion is formed on the housing, and the protrusion is located adjacent to the semiconductor module package, and is in contact with a surface of the semiconductor module package to press the semiconductor module package against the substrate, such that the substrate is curved in a direction away from the protrusion.

14. The semiconductor device according to claim 13, wherein the substrate has a higher thermal expansion coefficient and a lower elasticity coefficient than the protrusion.

15. The semiconductor device according to claim 13, wherein the substrate has a higher thermal expansion coefficient and a lower elasticity coefficient than the semiconductor module package.

16. The semiconductor device according to claim 13, wherein the semiconductor module package is electrically connected to the substrate through a plurality of electrodes disposed on the substrate, and the protrusion is located at a position facing at least one of the electrodes.

17. A semiconductor device, comprising:

a housing;

a substrate housed in and fixed to the housing; and a semiconductor module package disposed on a surface of the substrate, and having a lower thermal expansion coefficient and a higher elasticity coefficient than the substrate, wherein a protrusion is formed on the housing, the protrusion being in contact with the semiconductor module package or the surface of the substrate, and having a lower thermal expansion coefficient and a higher elasticity coefficient than the substrate.

18. The semiconductor device according to claim 17, further comprising:

a plurality of semiconductor memory modules disposed on the substrate, wherein the semiconductor module package includes a memory controller configured to control the plurality of semiconductor memory modules.

19. The semiconductor device according to claim 13, wherein the housing includes a first housing member and a second housing member coupled to the first housing member, the substrate is fixed to the first housing member, and the protrusion is formed on the second housing member.

20. The semiconductor device according to claim 13, wherein the protrusion is integrally formed with a base portion of the housing.

* * * * *